(12) United States Patent (10) Patent No.: US 9,257,217 B2
Yoshikawa et al. (45) Date of Patent: Feb. 9, 2016

(54) INDUCTOR ELEMENT, METHOD FOR MANUFACTURING INDUCTOR ELEMENT, AND WIRING BOARD

(71) Applicant: IBIDEN CO., LTD., Ogaki-shi (JP)

(72) Inventors: Kazuhiro Yoshikawa, Gifu (JP); Yasuhiko Mano, Gifu (JP)

(73) Assignee: IBIDEN CO., LTD., Ogaki-shi (JP)

( * ) Notice: Subject to any disclaimer, the term of this patent is extended or adjusted under 35 U.S.C. 154(b) by 24 days.

(21) Appl. No.: 13/954,431

(22) Filed: Jul. 30, 2013

(65) Prior Publication Data

US 2014/0034373 A1 Feb. 6, 2014

(30) Foreign Application Priority Data

Jul. 31, 2012 (JP) .................................. 2012-170672

(51) Int. Cl.
| | |
|---|---|
| *H05K 7/00* | (2006.01) |
| *H01F 5/00* | (2006.01) |
| *H05K 1/16* | (2006.01) |
| *H01F 41/32* | (2006.01) |
| *H01F 17/00* | (2006.01) |
| *H05K 1/18* | (2006.01) |

(52) U.S. Cl.
CPC .................. *H01F 5/003* (2013.01); *H01F 5/00* (2013.01); *H01F 17/0013* (2013.01); *H01F 41/32* (2013.01); *H05K 1/165* (2013.01); *H05K 1/185* (2013.01); *H01F 2017/0066* (2013.01); *H05K 2201/083* (2013.01); *H05K 2201/09672* (2013.01); *Y10T 29/4902* (2015.01)

(58) Field of Classification Search
CPC . H01F 5/00; H01F 27/00–27/35; H05K 7/00; H05K 1/00–1/18
USPC ............. 336/65, 83, 200, 206–208, 232–234; 361/760–766
IPC .......................................................... H01F 5/00
See application file for complete search history.

(56) References Cited

U.S. PATENT DOCUMENTS 5,583,474 A * 12/1996 Mizoguchi et al. ............. 336/83
2012/0212919 A1* 8/2012 Mano et al. .................... 361/782

FOREIGN PATENT DOCUMENTS

| GB | 2408389 A | * | 5/2005 |
|---|---|---|---|
| JP | 2002-158450 A | | 5/2002 |

* cited by examiner

*Primary Examiner* — Tuyen Nguyen
(74) *Attorney, Agent, or Firm* — Oblon, McClelland, Maier & Neustadt, L.L.P.

(57) ABSTRACT

An inductor element has a support layer, a first conductive layer formed on the support layer and having a first inductor pattern and a first pad at one end of the first inductor pattern, a first insulation layer formed on the support layer and first conductive layer and including a magnetic material layer and a resin layer, a second conductive layer formed on the first insulation layer and having a second inductor pattern and a second pad at one end of the second inductor pattern, and a via conductor formed through the first insulation layer and connecting the first and second conductive layers. The magnetic material layer is covering at least part of the first inductor pattern, the resin layer is covering the first pad and has opening exposing at least part of the first pad, and the via conductor is formed in the opening of the first insulation layer.

3 Claims, 27 Drawing Sheets

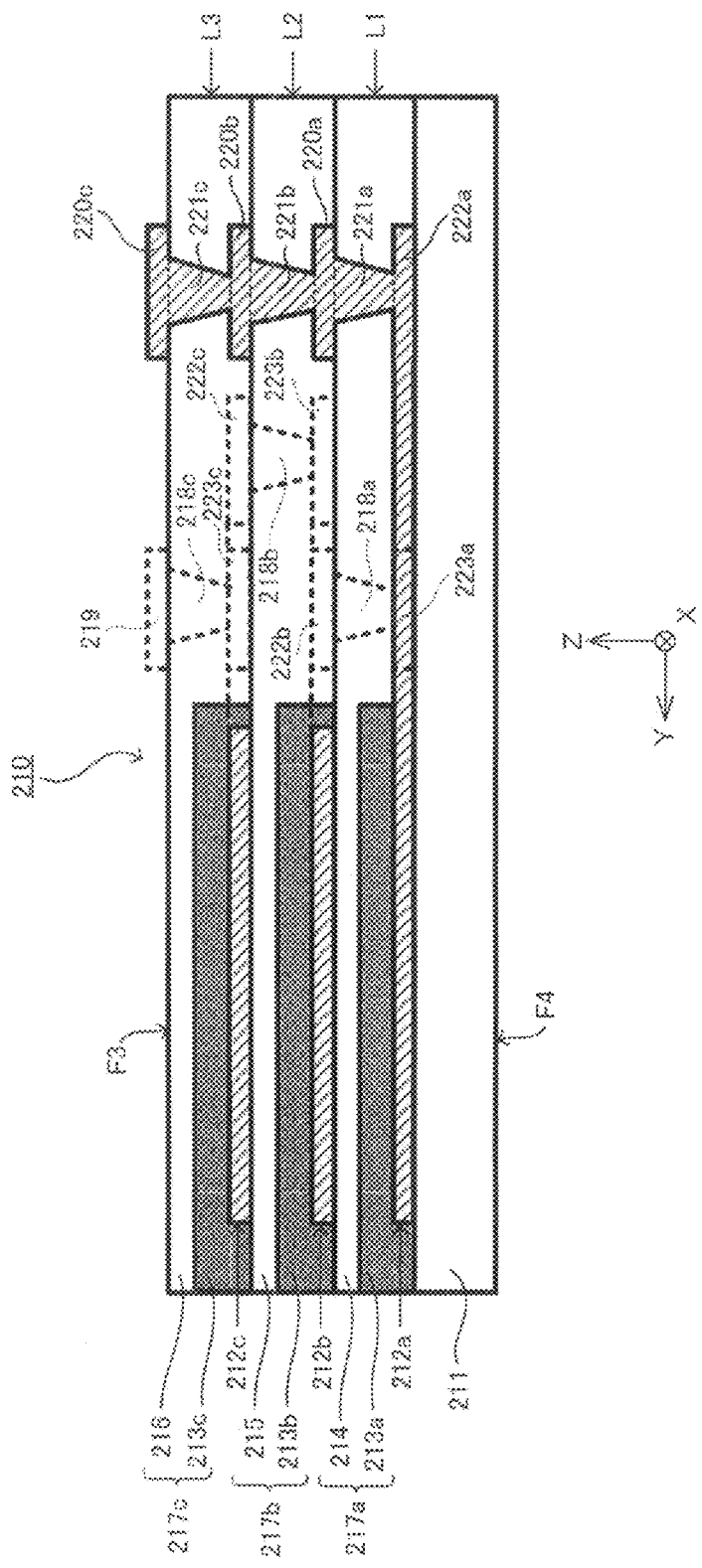

FIG. 8
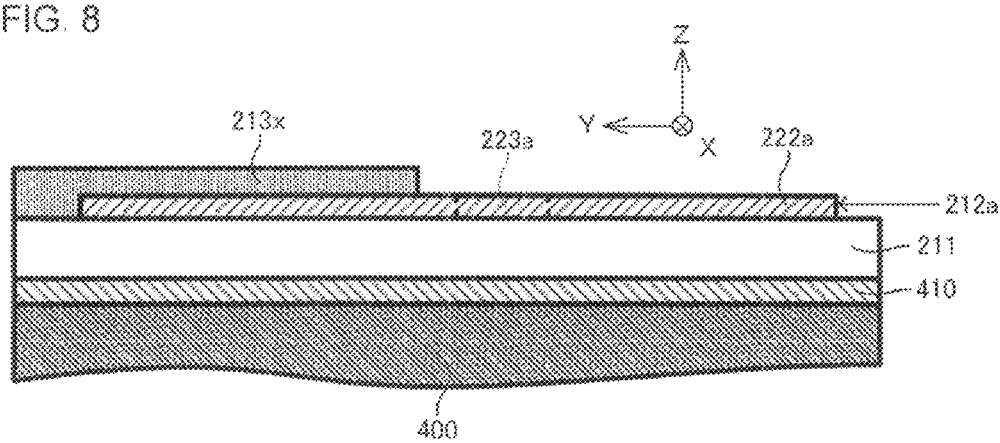
FIG. 9
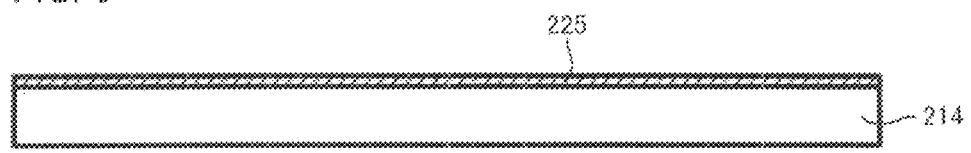
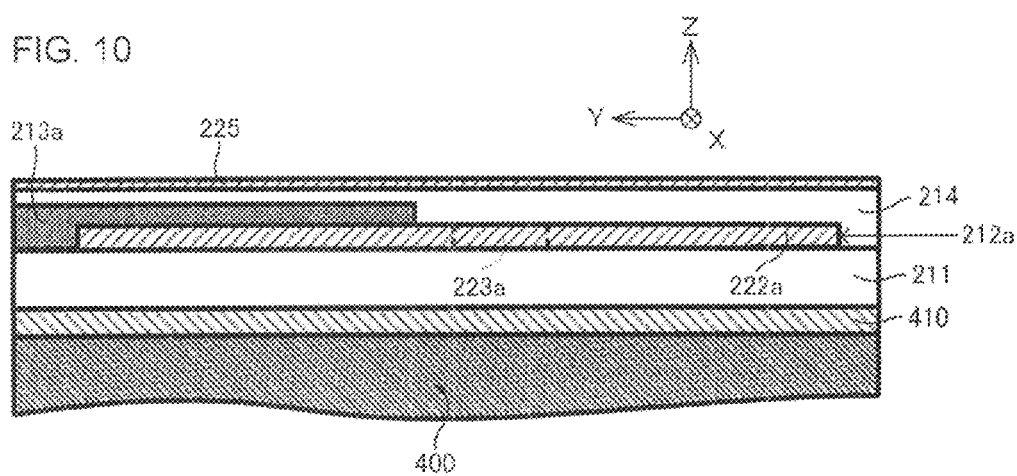
FIG. 10

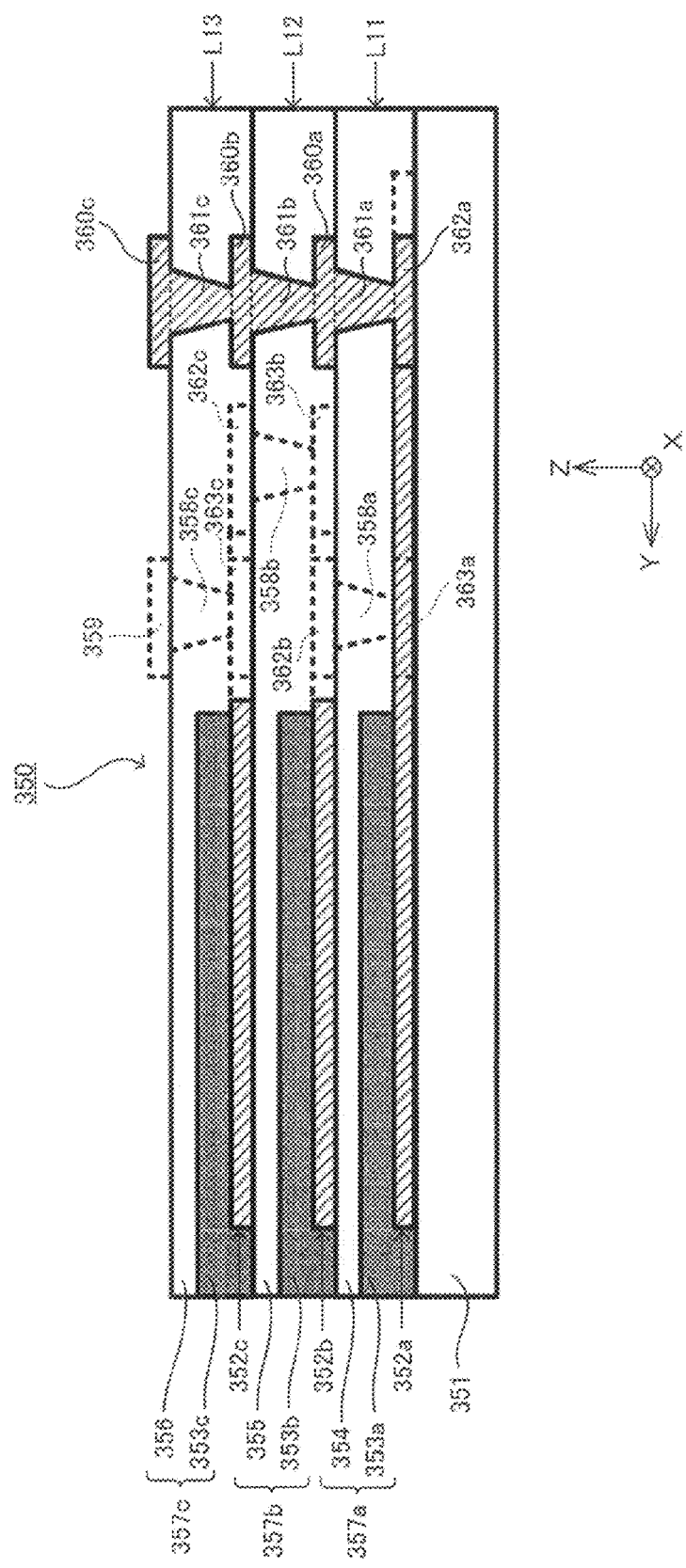

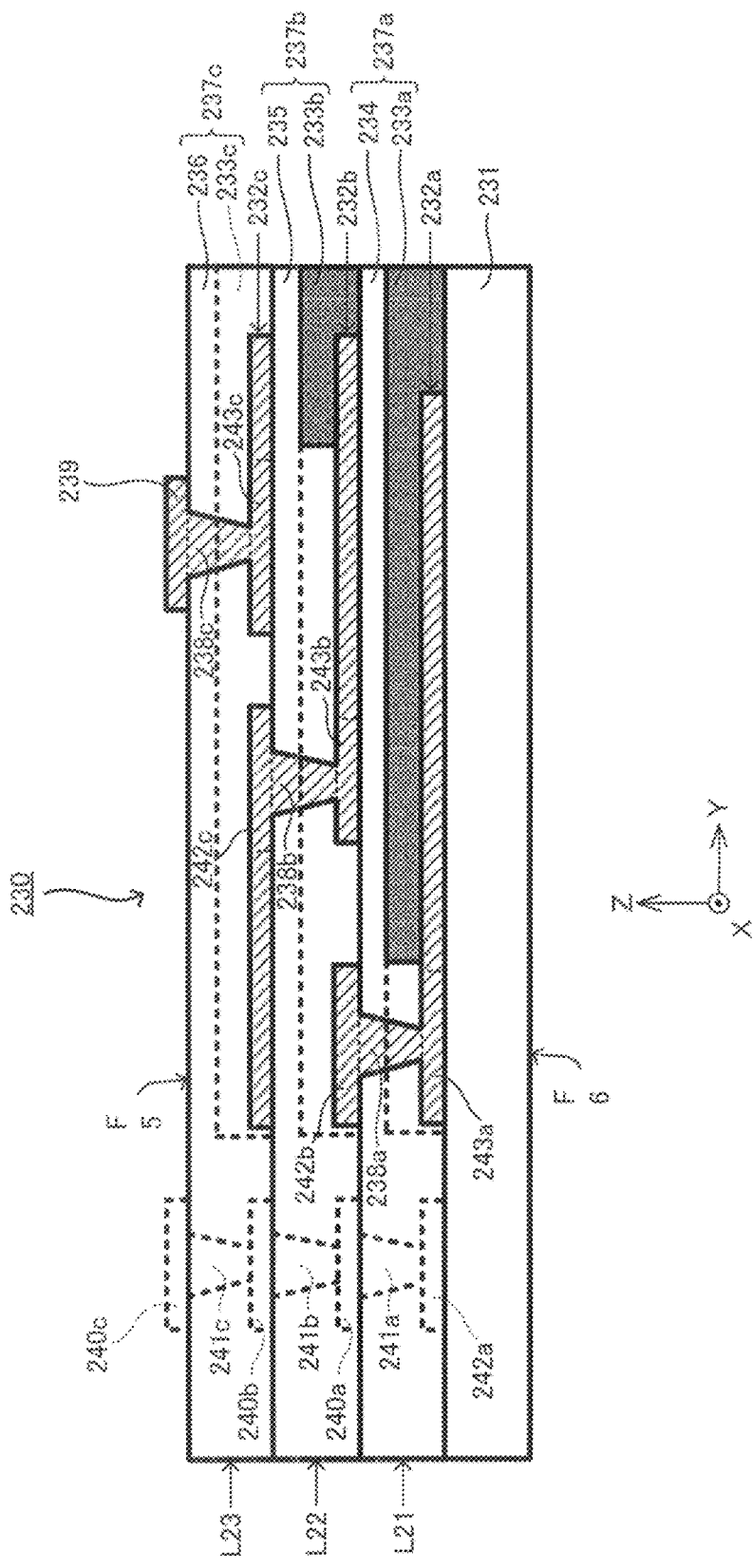

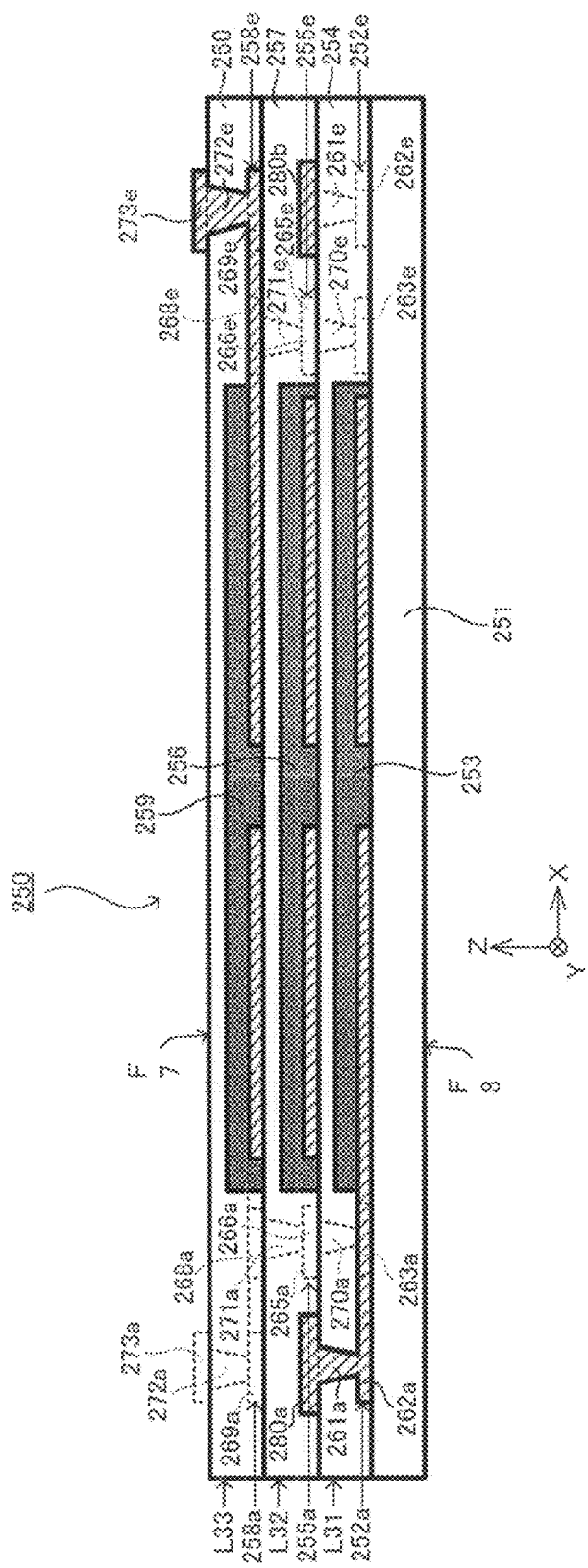

INDUCTOR ELEMENT, METHOD FOR MANUFACTURING INDUCTOR ELEMENT, AND WIRING BOARD

CROSS-REFERENCE TO RELATED APPLICATIONS

The present application is based upon and claims the benefit of priority to Japanese Patent Application No. 2012-170672, filed Jul. 31, 2012, the entire contents of which are incorporated herein by reference.

BACKGROUND OF THE INVENTION

1. Field of the Invention

The present invention relates to an inductor element, a method of manufacturing an inductor element, and a wiring board.

2. Description of Background Art

Japanese Laid-Open Patent Publication No. 2002-158450 describes a printed wiring board having an inductor element incorporated in the core material. The entire contents of this publication are incorporated herein by reference.

SUMMARY OF THE INVENTION

According to one aspect of the present invention, an inductor element includes a support layer, a first conductive layer formed on the support layer and having a first inductor pattern and a first pad formed at one end portion of the first inductor pattern, a first insulation layer formed on the support layer and first conductive layer and including a magnetic material layer and a resin layer, a second conductive layer formed on the first insulation layer and having a second inductor pattern and a second pad formed at one end portion of the second inductor pattern, and a via conductor formed through the first insulation layer and connecting the first conductive layer and the second conductive layer. The magnetic material layer of the first insulation layer is covering at least a portion of the first inductor pattern, the resin layer of the first insulation layer is covering the first pad and has an opening portion exposing at least a portion of the first pad, and the via conductor is formed in the opening portion of the first insulation layer.

According to another aspect of the present invention, a method of manufacturing an inductor element includes forming on a support layer a first conductive layer having a first inductor pattern and a first pad at one end portion of the first inductor pattern, forming on the first insulation layer and the first conductive layer a first insulation layer including a magnetic material layer and a resin layer, forming on the first insulation layer a second conductive layer having a second inductor pattern and a second pad at one end of the second inductor pattern, and forming a via conductor through the first insulation layer such that the via conductor connects the first and second conductive layers. The forming of the first insulation layer includes forming the magnetic material layer such that the magnetic material layer covers at least a portion of the first inductor pattern and forming the resin layer such that the resin layer covers the first pad, and the forming of the via conductor includes forming an opening portion through the first insulation layer such that the opening portion exposes at least a portion of the first pad and forming the via conductor in the opening portion.

According to yet another aspect of the present invention, a wiring board includes a substrate having an opening portion, and an inductor element positioned in the opening portion of the substrate and having a support layer, a first conductive layer formed on the support layer and having a first inductor pattern and a first pad formed at one end portion of the first inductor pattern, a first insulation layer formed on the support layer and first conductive layer and including a magnetic material layer and a resin layer, a second conductive layer formed on the first insulation layer and having a second inductor pattern and a second pad formed at one end portion of the second inductor pattern, and a via conductor formed through the first insulation layer and connecting the first conductive layer and the second conductive layer, The magnetic material layer of the first insulation layer is covering at least a portion of the first inductor pattern, the resin layer of the first insulation layer is covering the first pad and has an opening portion exposing at least a portion of the first pad, and the via conductor is formed in the opening portion of the first insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a cross-sectional view illustrating an inductor element according to the first embodiment of the present invention;

FIG. 8 is a diagram illustrating a process for forming a magnetic material layer on the first inductor pattern in the manufacturing method of FIG. 4;

FIG. 9 is a diagram illustrating a process for laminating a resin layer on the support layer, the first inductor pattern, and the magnetic material layer in the manufacturing method of FIG. 4;

FIG. 10 is a diagram illustrating a state in which the resin layer is laminated on the support layer, the first inductor pattern and the magnetic material layer in the manufacturing method of FIG. 4;

FIG. 33A is a cross-sectional view illustrating an inductor element according to a modification of the first embodiment of the present invention;

FIG. 34A is a cross-sectional view illustrating an inductor element according to a second embodiment of the present invention;

FIG. 35 is a cross-sectional view illustrating an inductor element according to a third embodiment of the present invention;

DETAILED DESCRIPTION OF THE EMBODIMENTS

Figure 1:
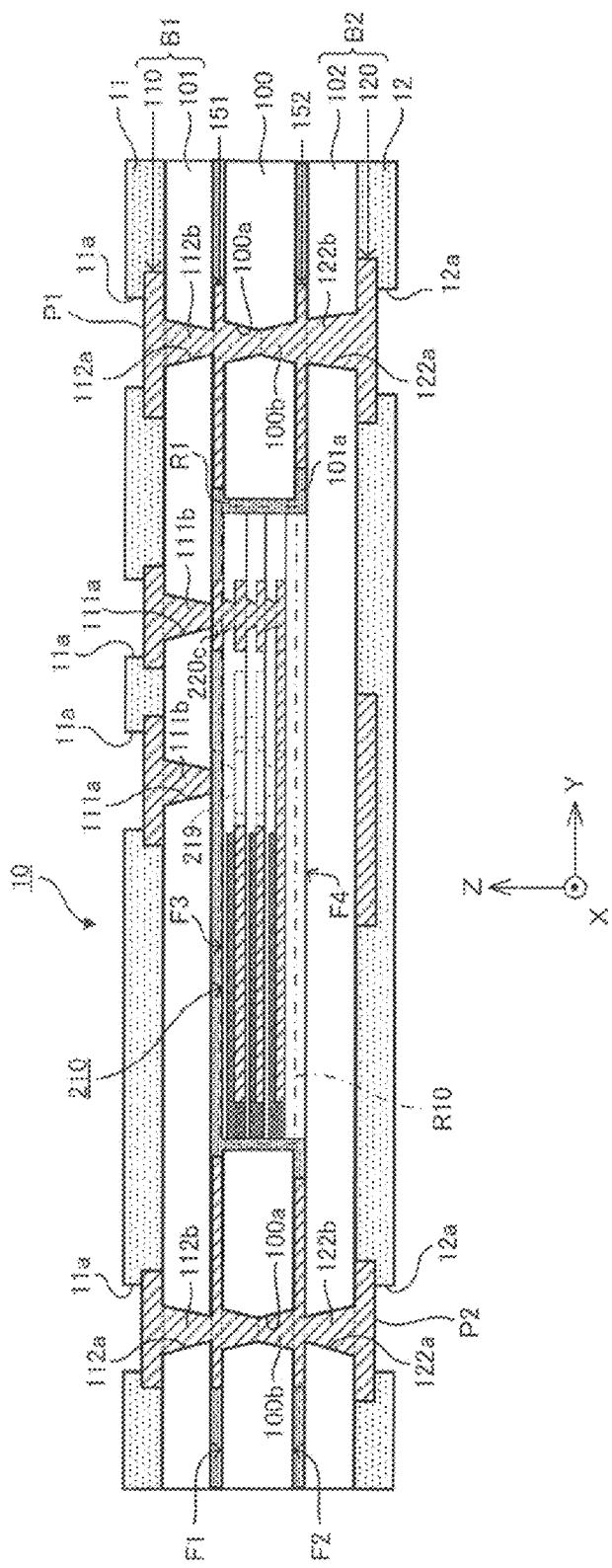
FIG. 1 is a cross-sectional view illustrating a wiring board according to a first embodiment of the present invention.

The embodiments will now be described with reference to the accompanying drawings, wherein like reference numerals designate corresponding or identical elements throughout the various drawings.

For the ease of understanding, a Cartesian (XYZ) coordinate system will be defined and appropriately referenced. In the drawings, the arrow Z indicates a direction of laminating an inductor element and a wiring board (or a thickness direction of the inductor element and the wiring board) corresponding to a direction along a normal line perpendicular to a main surface (upper or lower surface) of the inductor element and the wiring board. Meanwhile, the arrows X and Y indicate directions perpendicular to the lamination direction (or lateral directions of each layer). The main surface of the inductor element and the wiring board is defined as an X-Y plane. In addition, the lateral surface of the inductor element and the wiring board is defined as an X-Z plane or a Y-Z plane. In the lamination direction, a layer close to the support layer and the substrate will be referred to as a lower layer (or inner layer side), and a layer far from the support layer (and the substrate) will be referred to as an upper layer (or external layer side).

A "hole" refers to a non-penetrating hole as well as a penetrating hole. A "hole" also includes a via hole and a through hole. Hereinafter, a conductor formed inside a via hole (formed in a wall surface or a bottom surface) will be referred to as a "via conductor," and a conductor formed inside a through hole (formed on a wall surface) will be referred to as a "through-hole conductor." A "diameter" or "inner diameter" refers to an average value between maximum and minimum values of a diameter or an inner diameter of a hole unless specified otherwise.

"Plating" refers to not only a process for forming a metal layer, but also a metal or a metal layer formed by such a process. Plating includes dry plating such as physical vapor deposition (PVD) or chemical vapor deposition (CVD) as well as wet plating such as electroless plating or electrolytic plating.

A "planar shape" refers to a shape as seen from the lamination direction of the inductor element and the wiring board, that is, as seen from the Z direction. In addition, the planar shape includes a circular shape, a rectangular shape (see FIGS. 2A to 2C, 33B to 33D, 34B to 34D, and 37 to 41), an elliptical shape, a polygonal shape and the like.

First Embodiment

The first embodiment of the present invention will be described with reference to FIGS. 1 to 33D. First, a structure of a wiring board 10 according to the first embodiment will be described with reference to FIG. 1.

The wiring board 10 according to the first embodiment includes a substrate 100 (insulation substrate), a first build-up portion (B1), a second build-up portion (B2), an inductor element 210, and solder resists (11, 12) as illustrated in FIG. 1. The wiring board 10 according to the first embodiment is a rigid wiring board shaped like a rectangular plate. Alternatively, the wiring board 10 may be a flexible wiring board. Hereinafter, one of the upper and lower surfaces (a pair of main surfaces) of the substrate 100 will be referred to as a first surface (F1), and the other surface will be referred to as a second surface (F2). In addition, of the upper and lower surfaces (a pair of main surfaces) of the inductor element 210, a surface facing the same direction as that of the first surface (F1) will be referred to as a third surface (F3), and the other surface will be referred to as a fourth surface (F4).

The first build-up portion 1 is formed on the first-surface (F1) side of the substrate 100. The second build-up portion (B2) is formed on the second-surface (F2) side of the substrate 100. The first build-up portion (B1) includes an insulation layer 101 (interlayer insulation layer) and a conductive layer 110. The second build-up portion (B2) includes an insulation layer 102 (interlayer insulation layer) and a conductive layer 120. The inductor element 210 is embedded in the wiring board 10. The solder resists (11, 12) are formed on the first and second build-up portions (B1, B2), respectively.

The substrate 100 is insulative and serves as a core substrate of the wiring board 10. A conductive layer 151 is formed on the first surface (F1) of the substrate 100. A conductive layer 152 is formed on the second surface (F2) of the substrate 100. A cavity (opening) (R10) is formed in the substrate 100. The inductor element 210 is filled in the cavity (R10). The cavity (R10) includes a penetrating hole that penetrates through the substrate 100. The opening shapes at both ends (on the first-surface (F1) side and on the second-surface (F2) side) are approximately rectangular. The inductor element 210 is shaped, for example, like a rectangular plate, and the main surface of the inductor element 201 has, for example, an approximately rectangular shape. According to the first embodiment, the inductor element 210 has a planar shape corresponding to that of the cavity (R10) (for example, a similar figure having approximately the same size).

The cavity (R10) may not penetrate through the substrate 100. That is, the cavity (R10) may have a depth shallower than the thickness of the substrate 100 and may be bottomed.

According to the first embodiment, approximately the entire inductor element 210 is filled in the cavity (R10). However, the present invention is not limited to that. Alternatively, only part of the inductor element 210 may be arranged in the cavity (R10). According to the first embodiment, an insulator (101a) is filled in a gap (R1) between the substrate 100 and the inductor element 210 in the cavity (R10). According to the first embodiment, the insulator 101a is made of the same insulation material (specifically, resin) as that of the upper insulation layer 101 (specifically, resin insulation layer) (see FIG. 31). The insulator (101a) has a thermal expansion coefficient higher than that of any one of the substrate 100 and the inductor element 210. The insulator (101a) perfectly covers the circumference of the inductor element 210. As a result, the inductor element 210 is protected by the insulator (101a) (resin) and is fixed in a predetermined position.

In addition, the insulator (101a) may be made of a material different from that of the upper insulation layer 101.

The insulation layer 101 is formed on the first surface (F1) of the substrate 100 and the third surface (F3) of the inductor element 210. The insulation layer 102 is formed on the second surface (F2) of the substrate 100 and the fourth surface (F4) of the inductor element 210. In addition, one of the openings (in the first-surface (F1) side) of the cavity (R10) (penetrating hole) is blocked by the insulation layer 101. The other opening (in the second-surface (F2) side) of the cavity (R10) (penetrating hole) is blocked by the insulation layer 102. According to the first embodiment, the conductive layers 110 and 120 serve as the outermost layer. However, the present invention is not limited to that. Alternatively, more interlayer insulation layers and conductive layers may be laminated.

The conductive layer 110 serves as the outermost conductive layer in the first-surface (F1) side, and the conductive layer 120 serves as the outermost conductive layer in the second-surface (F2) side. The solder resists (11, 12) are formed on the conductive layers (110, 120), respectively. However, openings (11a, 12a) are formed in the solder resists (11, 12), respectively. For this reason, a predetermined portion of the conductive layer 110 (portion where the opening (11a) is located) is not covered by the solder resist 11 but is exposed to be a pad (P1). Similarly, a predetermined portion of the conductive layer 120 (portion where the opening (12a) is located) is a pad (P2). The pad (P1) serves as an external connection terminal, for example, for electrically connecting other wiring boards. The pad (P2) serves as an external connection terminal, for example, for mounting an electric component. However, the pads (P1, P2) may be used for any purpose without limiting thereto.

According the present embodiment, the pads (P1, P2) have an anti-corrosion layer made of, for example, an Ni/Pd/Au film on its surface. The anti-corrosion layer may be formed through electrolytic plating, sputtering, or the like. In addition, the anti-corrosion layer may be formed of an organic protection film by performing organic solderability preservative (OSP) treatment. In addition, the anti-corrosion layer may be dispensable and may be omitted as necessary.

A through hole (100a) is formed in the substrate 100 (core substrate), and a conductor (for example, copper plating) is filled in the through hole (100a) so as to form a through-hole conductor (100b). According to the first embodiment, the through-hole conductor (100b) has an hourglass shape (handdrum shape). A land of the through-hole conductor (100*b*) is included in the conductive layers (151, 152).

Holes (111*a*, 112*a*) (via holes) are formed in the insulation layer 101. In addition, a hole (122*a*) (via hole) is formed in the insulation layer 102. As a conductor (for example, copper plating) is filled in the holes (111*a*, 112*a*, 122*a*), and the conductors in each hole serve as via conductors (111*b*, 112*b*, 122*b*) (filled conductors). The hole 111*a* reaches the input and output terminals (220*c*, 219) of the inductor element 210. The via conductor (111*b*) is electrically connected to the input and output terminals (220*c*, 219) of the inductor element 210 from the first-surface (F1) side of the substrate 100.

The conductive layer 151 on the first surface (F1) of the substrate 100 and the conductive layer 110 on the insulation layer 101 are electrically connected to each other through the via conductor (112*b*). In addition, the conductive layer 152 on the second surface (F2) of the substrate 100 and the conductive layer 120 on the insulation layer 102 are electrically connected to each other through the via conductor (122*b*). Furthermore, the conductive layer 151 on the first surface (F1) of the substrate 100 and the conductive layer 152 on the second surface (F2) of the substrate 100 are electrically connected to each other through the through-hole conductor (100*b*). All of the via conductors (112*b*, 122*b*) and the through-hole conductor (100*b*) are filled conductors. By stacking the via conductors (112*b*, 122*b*) and the through-hole conductor (100*b*) in the Z direction, a stacked structure is formed.

The substrate 100 is made of, for example, a material (hereinafter referred to as "glass epoxy") obtained by impregnating epoxy resin into glass cloth (core material). The core material has a thermal expansion coefficient lower than that of a main material (epoxy resin in the first embodiment). It is thought that the core material preferably includes an inorganic material such as glass fiber (such as glass cloth or nonwoven glass fabric), aramid fiber (such as nonwoven aramid fabric), and a silica filler. However, basically, any material may be used in the substrate 100. For example, instead of epoxy resin, polyester resin, bismaleimide triazine resin (BT resin), imide resin (polyimide), phenol resin, allylated phenylene ether resin (A-PPE resin) or the like may be used. The substrate 100 may include multiple layers made of different materials.

According to the first embodiment, each of the insulation layers (101, 102) is obtained by impregnating the core material into resin. The insulation layers (101, 102) are made of, for example, glass epoxy. However, they are not limited to that, and the insulation layers (101, 102) may be made of, for example, resin that does not contain the core material. Basically, any material may be used in the insulation layers (101, 102). For example, instead of epoxy resin, polyester resin, bismaleimide triazine resin (BT resin), imide resin (polyimide), phenol resin, allylated phenylene ether resin (A-PPE resin), or the like may be used. Each insulation layer may include multiple layers made of different materials.

The conductive layer 110 includes a copper foil (lower layer) and copper plating (upper layer). The conductive layer 120 includes a copper foil (lower layer) and copper plating (upper layer). The conductive layers (110, 120) have, for example, a flat plate-like pattern or the like for enhancing strength of wiring, a land, and a wiring board 10 included in an electric circuit (for example, an electric circuit including the inductor element 210).

Any conductive material may be used in each conductive layer and each via conductor. The conductive material may be either metal or non-metal. Each conductive layer and each via conductor may include multiple layers made of different materials.

Next, a structure of the inductor element 210 according to the first embodiment will be described with reference to FIGS. 2, 3A, 3B and 3C.

Figure 3A:
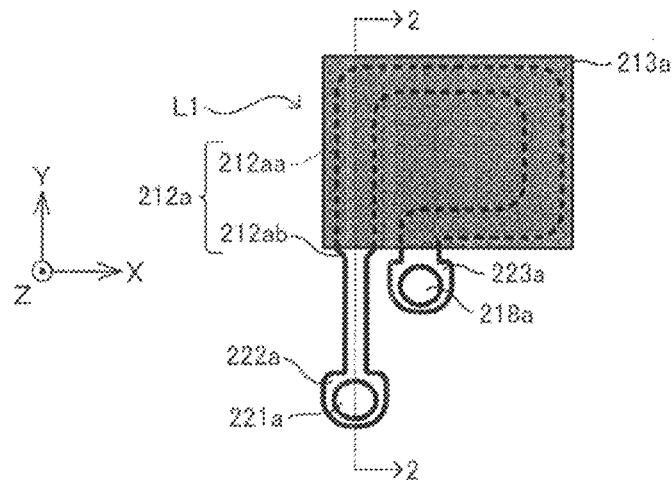
FIG. 3A is a plan view illustrating a first layer of the inductor element according to the first embodiment of the present invention.
Figure 3B:
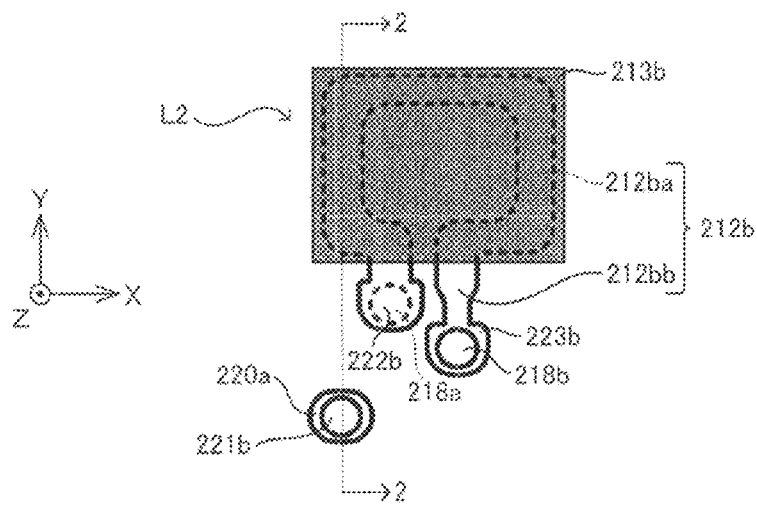
FIG. 3B is a plan view illustrating a second layer of the inductor element according to the first embodiment of the present invention.
Figure 3C:
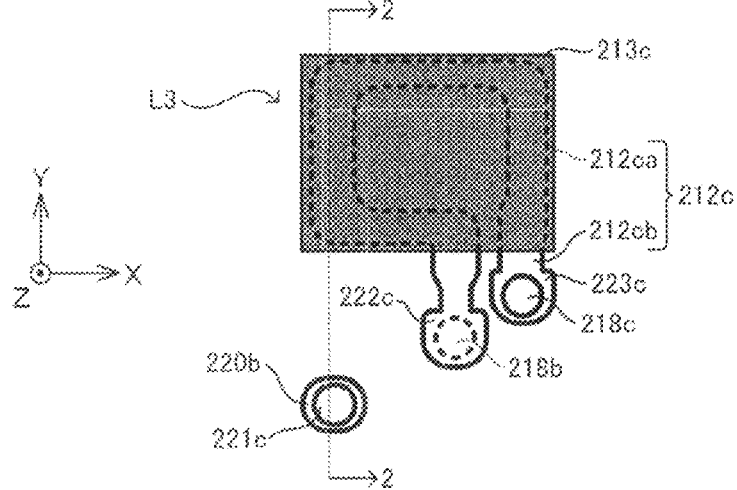
FIG. 3C is a plan view illustrating a third layer of the inductor element according to the first embodiment of the present invention.

FIG. 2 is a cross-sectional view illustrating the inductor element 210 according to the first embodiment. FIG. 3A is a schematic diagram illustrating a first layer (L1) of the inductor element 210 as seen from the +Z direction. FIG. 3B is a schematic diagram illustrating a second layer (L2) of the inductor element 210 as seen from the +Z direction. FIG. 3C is a schematic diagram illustrating a third layer (L3) of the inductor element 210 as seen from the +Z direction. In FIGS. 3A to 3C, the resin layers (214, 215, 216) are not shown.

As illustrated in FIG. 2, the inductor element 210 includes a support layer (insulation layer) 211, a first layer (L1) on the support layer 211, a second layer (L2) on the first layer (L1), and a third layer (L3) on the second layer (L2), and input and output terminals (220*c*, 219) on the third layer (L3).

The first layer (L1) includes a first inductor pattern (212*a*), an interlayer insulation layer (217*a*), and via conductors (218*a*, 221*a*). The interlayer insulation layer (217*a*) includes a magnetic material layer (213*a*) and a resin layer 214.

The second layer (L2) includes a second inductor pattern (212*b*), an interlayer insulation layer (217*b*), a via conductor 218*b* and a via conductor (221*b*). The interlayer insulation layer (217*b*) includes a magnetic material layer (213*b*) and a resin layer 215.

The third layer (L3) includes a third inductor pattern (212*c*), an interlayer insulation layer (217*c*), and via conductors (218*c*, 221*c*). The interlayer insulation layer (217*c*) includes a magnetic material layer (213*c*) and a resin layer 216.

As illustrated in FIG. 3A, the first inductor pattern (212*a*) has a first portion (212*aa*) which overlaps the magnetic material layer (213*a*), and a second portion (212*ab*) which is the rest of the first inductor pattern (212*a*). That is, at least part (first portion) of the first inductor pattern (212*a*) is covered by the magnetic material layer (213*a*). The first portion (212*aa*) is formed in a C-shape. This first portion mainly serves as an inductor. A first output pad (223*a*) and a first input pad (222*a*) are provided at respective ends of the second portion (212*ab*). Here, as illustrated in FIG. 3A, the first output pad (223*a*) of the first inductor pattern (212*a*) is provided on the same side as that of the first input pad (222*a*). Accordingly, the magnetic material layer (213*a*) is formed to be approximately a rectangular shape when seen on a planar view. As a result, it is easy to form the magnetic material layer (213*a*).

As illustrated in FIG. 2, a magnetic material layer (213*a*) that covers the first portion (212*aa*) and a resin layer 214 that covers both the first and second portions (212*aa*, 212*ab*) of the first inductor pattern (212*a*) are formed on the first inductor pattern (212*a*). The magnetic material layer (213*a*) contains magnetic particles and resin. The via conductors (218*a*, 221*a*) are formed inside the via hole provided in the resin layer 214. The via conductor (218*a*) is formed on the first output pad (223*a*). The via conductor (221*a*) is formed on the first input pad (222*a*).

As illustrated in FIG. 2, the second inductor pattern (212*b*) is formed on the resin layer 214. In addition, a laminated pad (220*a*) is formed on the resin layer 214. The laminated pad (220*a*) is electrically connected to the first input pad (222*a*) through the via conductor (221*a*). That is, the magnetic material layer (213*a*) is covered by the resin layer 214. In this case, a conductive layer (such as a second inductor pattern (212*b*))

is formed on the flat resin layer 214 that contains no magnetic particle. As a result, the conductive layer is adhered to the resin layer (insulation layer).

As illustrated in FIG. 3B, the second inductor pattern (212b) includes a first portion (212ba) which overlaps the magnetic material layer (213b), and a second portion (212bb) which is the rest of second inductor pattern (212b). That is, at least part (first portion) of the second inductor pattern (212b) is covered by the magnetic material layer (213b). The first portion (212ba) is formed in a C-shape. The first portion mainly serves as an inductor. A second output pad (223b) and a second input pad (222b) are provided at respective ends of the second portion (212bb). Here, as illustrated in FIG. 3B, the second output pad (223b) of the second inductor pattern (212b) is provided on the same side as that of the second input pad (222b). As a result, the magnetic material layer (213b) is formed in an integrated way in an approximately rectangular shape as seen in a plan view. As a result, it is easy to form the magnetic material layer (213b).

The second input pad (222b) of the second inductor pattern (212b) is electrically connected to the first output pad (223a) through the via conductor (218a). The via conductors (218a, 221a) penetrate through the resin layer 214.

As illustrated in FIG. 2, the magnetic material layer (213b) that covers the first portion (212ba) is formed on the second inductor pattern (212b). In addition, the resin layer 215 that covers both the first and second portions (212ba, 212bb) of the second inductor pattern (212b) is formed. The magnetic material layer (213b) contains magnetic particles and resin. The via conductors (218b, 221b) are formed inside the via hole provided in the resin layer 215. The via conductor (218b) is formed on the second output pad (223b). The via conductor (221b) is formed on the laminated pad (220a).

As illustrated in FIG. 2, the third inductor pattern (212c) is formed on the resin layer 215. In addition, the laminated pad (220b) is formed on the resin layer 215. That is, the magnetic material layer (213b) is covered by the resin layer 215. In this case, a conductive layer (such as the third inductor pattern (212c) is formed on the flat resin layer 215 that contains no magnetic particle. As a result, the conductive layer is adhered to the resin layer (insulation layer).

The laminated pad (220b) is electrically connected to the laminated pad (220a) through the via conductor (221b). The third input pad (222c) of the third inductor pattern (212c) is electrically connected to the second output pad (223b) through the via conductor (218b). The via conductors (218b, 221b) penetrate through the resin layer 215.

As illustrated in FIG. 3, the third inductor pattern (212c) includes a first portion (212ca), which overlaps the magnetic material layer (213c), and a second portion (212cb) which is the rest of third inductor pattern (212c). That is, at least part (first portion) of the third inductor pattern (212c) is covered by the magnetic material layer (213c). The first portion (212ca) is formed in a C-shape. The first portion mainly serves as an inductor. A third output pad (223c) and a third input pad (222c) are provided at respective ends of the second portion (212cb). Here, as illustrated in FIG. 3C, the third output pad (223c) of the third inductor pattern (212c) is provided on the same side as that of the third input pad (222c). As a result, the magnetic material layer (213c) is formed in an integrated way in an approximately rectangular shape as seen in a plan view. As a result, it is easy to form the magnetic material layer (213c).

As illustrated in FIG. 2, the magnetic material layer (213c) that covers the first portion (212ca) is formed on the third inductor pattern (212c). In addition, the resin layer 216 that covers both the first and second portions (212ca, 212cb) of the third inductor pattern (212c) is formed. The magnetic material layer (213c) contains magnetic particles and resin. The via conductors (218c, 221c) are formed inside the via hole provided in the resin layer 216. The via conductor (218c) is formed on the third output pad (223c). The via conductor (221c) is formed on the laminated pad (220b).

The input terminal (220c) and the output terminal 219 are formed on the resin layer 216. The input terminal (220c) is electrically connected to the laminated pad (220b) through the via conductor (221c). The output terminal 219 is electrically connected to the third output pad (223c) through the via conductor (218c). The via conductors (218c, 221c) penetrate through the resin layer 216.

In this manner, the first inductor pattern (212a), the via conductor (218a), the second inductor pattern (212b), the via conductor (218b) and the third inductor pattern (212c) constitute a three-turn inductor. In addition, all of the via conductors (221a, 221b, 221c) are filled conductors stacked in the Z direction. Such a stacked structure is advantageous in miniaturizing the inductor element 210.

In the inductor element 210 according to the first embodiment, an electric current is input from the input terminal (220c), is conducted through a stacked structure including the via conductors (221a, 221b, 221c), enters the first inductor pattern (212a), passes through the three-turn inductor, and is output from the output terminal 219. In the inductor element 210 according to the first embodiment, the input terminal (220c) and the output terminal 219 are formed on the same surface (third surface F3). As a result, in a case where the inductor element 210 is incorporated in the core substrate 100 of the wiring board 10, it is easy to form wiring to the inductor element 210.

According to the first embodiment, any material may be used as a material of the support layer 211 and each resin material of the interlayer insulation layers (217a, 217b, 217c). For example, the material of the support layer 211 and the resin materials of the interlayer insulation layers (217a, 217b, 217c) may include epoxy resin, polyester resin, bismaleimide triazine resin (BT resin), imide resin (polyimide), phenol resin, allylated phenylene ether resin (A-PPE resin) or the like. Each layer may include multiple layers made of different materials.

The resin of the magnetic material layers (213a, 213b, 213c) preferably has a glass transition temperature Tg equal to or higher than 130° C. If the resin of the magnetic material layers (213a, 213b, 213c) has a glass transition temperature equal to or higher than 130° C., the magnetic material layers (213a, 213b, 213c) are not easily deformed when the inductor element 210 is heated inside the wiring board, compared with the glass transition temperature being lower than 130° C.

Basically, an insulative resin material may be used in the resin of the magnetic material layers (213a, 213b, 213c). Preferably, a heat-resistant resin is used. Specifically, the resin of the magnetic material layers (213a, 213b, 213c) preferably includes, for example, phenol resin, polybenzoxazole resin, polyphenylene resin, polybenzocyclobutene resin, polyarylene ether resin, polysiloxane resin, polyurethane resin, polyester resin, polyester urethane resin, fluororesin, polyolefin resin, polycycloolefin resin, cyanate resin, polyphenylene ether resin, polystyrene resin, a mixture thereof, or the like.

An average particle diameter of magnetic particles of the magnetic material layers (213a, 213b, 213c) is set at, for example, 0.5 to 50 μm. The average particle diameter of the magnetic particles is computed based on a result obtained by actually measuring the particle diameters of multiple magnetic particles using a scanning electron microscope (SEM)

photograph. According to the present embodiment, for example, the average particle diameter of the magnetic particles is computed from the measurement results of a hundred magnetic particles. If the average particle diameter of the magnetic particles is equal to or larger than 0.5 µm, cohesion of the magnetic particles becomes difficult, compared with a case where the average particle diameter is smaller than 0.5 µm. For this reason, it is easy to disperse the magnetic particles uniformly in the magnetic material layers (213a, 213b, 213c). If the average particle diameter of the magnetic particles is equal to or smaller than 50 µm, frictional resistance between particles is reduced, compared with a case where the average particle diameter is larger than 50 µm. For this reason, it is easy to form the magnetic material layers (213a, 213b, 213c) with a uniform thickness.

The volume content of the magnetic particles of the magnetic material layers (213a, 213b, 213c) is preferably set at 30 to 70 volume %. If the volume content is equal to or higher than 30 volume %, magnetic characteristics of the inductor element 210 are improved, compared with the volume content being lower than 30 volume %. If the volume content is equal to or lower than 70 volume %, frictional resistance between particles is reduced, compared with a case where the volume content is higher than 70 volume %. For this reason, if the volume content of the magnetic particles is set in the aforementioned range, it is easy to form the magnetic material layers (213a, 213b, 213c) with a uniform thickness.

As the magnetic material of the magnetic particles, any soft magnetic material may be used. For example, the soft magnetic material may include iron, a soft magnetic iron alloy, nickel, a soft magnetic nickel alloy, cobalt, a soft magnetic cobalt alloy, a soft magnetic iron(Fe)-silicon(Si)-based alloy, a soft magnetic iron(Fe)-nitrogen(N)-based alloy, a soft magnetic iron(Fe)-carbon(C)-based alloy, a soft magnetic iron (Fe)-boron(B)-based alloy, a soft magnetic iron(Fe)-phosphorous(P)-based alloy, a soft magnetic iron(Fe)-aluminum (Al)-based alloy, a soft magnetic iron(Fe)-aluminum(Al)-silicon(Si)-based alloy and the like.

The thicknesses of the magnetic material layers (213a, 213b, 213c) are larger than the respective thicknesses of the resin layers (214, 215, 216), which cover the magnetic material layers (213a, 213b, 213c), respectively. As a result, a sufficient amount of the magnetic particles can be contained in the magnetic material layers (213a, 213b, 213c). As a result, inductance of the inductor element 210 is further improved. Specifically, the thicknesses of the magnetic material layers (213a, 213b, 213c) are within a range of, for example, 20 to 100 µm, and the thicknesses of the resin layers (214, 215, 216) are preferably within a range of, for example, 10 to 60 µm in a portion where the magnetic material layers (213a, 213b, 213c) exist.

The resin layers (214, 215, 216) are formed of a resin material. Basically, the resin material may be an insulative resin material. Preferably, the resin material is heat-resistant. Specifically, the resin material preferably includes, for example, epoxy resin, phenol resin, polybenzoxazole resin, polyphenylene resin, polybenzocyclobutene resin, polyarylene ether resin, polysiloxane resin, polyurethane resin, polyester resin, polyester urethane resin, fluororesin, polyolefin resin, polycycloolefin resin, cyanate resin, polyphenylene ether resin, polystyrene resin, a mixture thereof, and the like.

Preferably, the resin layers (214, 215, 216) contain a resin component soluble in a roughening solution and a resin component insoluble in a roughening solution. Specifically, the resin layers (214, 215, 216) are formed by mixing a resin component soluble in a roughening solution such as permanganic acid or chromic acid by increasing a polar group and a resin component insoluble in the roughening solution such as permanganic acid or chromic acid. As a result, through a roughening process, the surface of the resin layer is roughened so that adhesion of the conductive layer to the resin layer is obtained.

Preferably, the resin material of the magnetic material layers (213a, 213b, 213c) is the same as the resin material of the resin layers (214, 215, 216). If the same material is used between the resin material of the magnetic material layers and the resin material of the resin layers, adhesion between the magnetic material layers (213a, 213b, 213c) and the resin layers (214, 215, 216) is improved. In addition, linear expansion coefficients of the resin layers (214, 215, 216) are preferably lower than those of the magnetic material layers (213a, 213b, 213c). If a linear expansion coefficient of the resin layer is lower than that of the magnetic material layer, a possibility of thermal deformation in the magnetic material layers (213a, 213b, 213c) is reduced.

According to the first embodiment, epoxy resin is used as a material of the support layer 211. In addition, epoxy resin is used as the resin of the magnetic material layers (213a, 213b, 213c) and the resin of the resin layers (214, 215, 216).

The support layer 211 and the resin layers (214, 215, 216) may contain an inorganic filler. As a result, it is easy to make the linear expansion coefficients of the resin layers (214, 215, 216) lower than those of the magnetic material layers (213a, 213b, 213c). The inorganic filler may include, for example, glass fiber, glass particles, calcium carbonate, sodium carbonate, barium sulfate, aluminum hydroxide, alumina, silica, diatomite, mica, talc or the like.

In the inductor element 210 according to the first embodiment, the inductor pattern is connected to a portion extracted from the magnetic material layer. As a result, in a case where the magnetic material layers have the same area, an effective area of the magnetic material layer relative to that of the inductor pattern increases, compared with a case where a via hole is formed in the magnetic material layer to connect the inductor pattern. Therefore, inductance is increased without increasing the area of the magnetic material layer. Accordingly, the inductor element is miniaturized and made thinner.

As described above, in the inductor element 210 according to the first embodiment, the first inductor pattern (212a), the second inductor pattern (212b) and the second portions (212ab, 212bb, 212cb) of the third inductor pattern (212c) are extracted from the magnetic material layer. Accordingly, the first portions (212aa, 212ba, 212ca) and the second portions (212ab, 212bb, 212cb) are partitioned along a straight line. As a result, the magnetic paste is easily coated.

In the wiring board 10 according to the first embodiment, the inductor element 210 is incorporated in the cavity (R10) of the core substrate 100. As a result, the core substrate 100 is made thinner and the thickness of the entire wiring board 10 is reduced.

Figure 4:
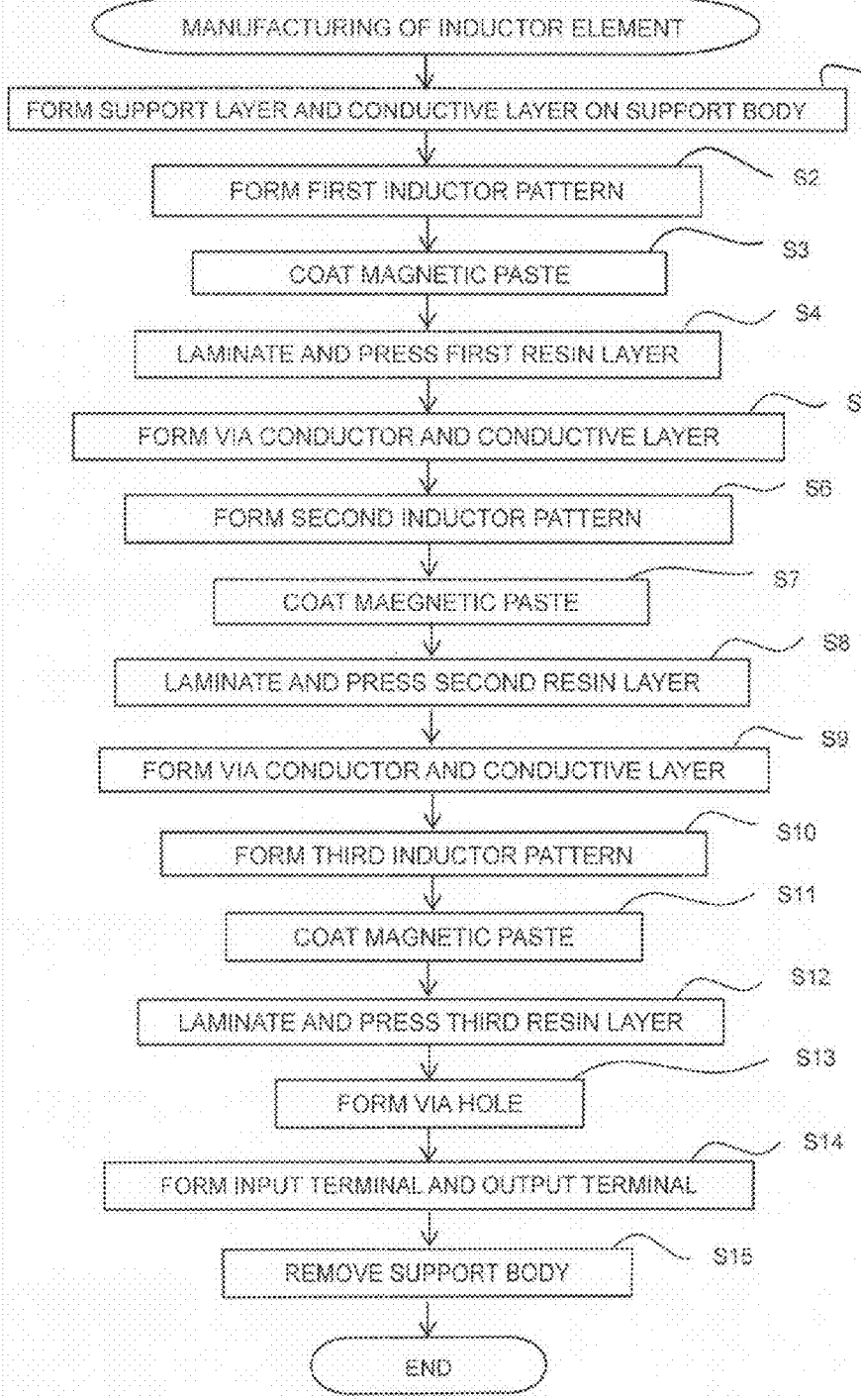
FIG. 4 is a flowchart illustrating a method of manufacturing an inductor element according to the first embodiment of the present invention.

A method of manufacturing the inductor element 210 will be described with reference to FIG. 4 and the like. FIG. 4 is a flowchart schematically illustrating the method of manufacturing the inductor element 210 according to the first embodiment and a sequence thereof.

In Step (S1), a support layer and a conductive layer are formed on a support body.

Figure 5:
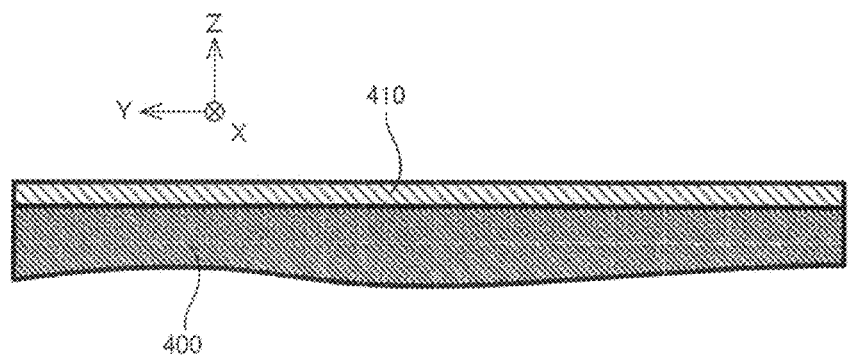
FIG. 5 is a cross-sectional view illustrating a support body serving as a base for manufacturing the inductor element in the manufacturing method of FIG. 4.

Specifically, first, as illustrated in FIG. 5, a support body 400 is prepared as a base for manufacturing the inductor element 210. The support body 400 is an insulator having a copper foil 410 formed on one surface.

Figure 6:
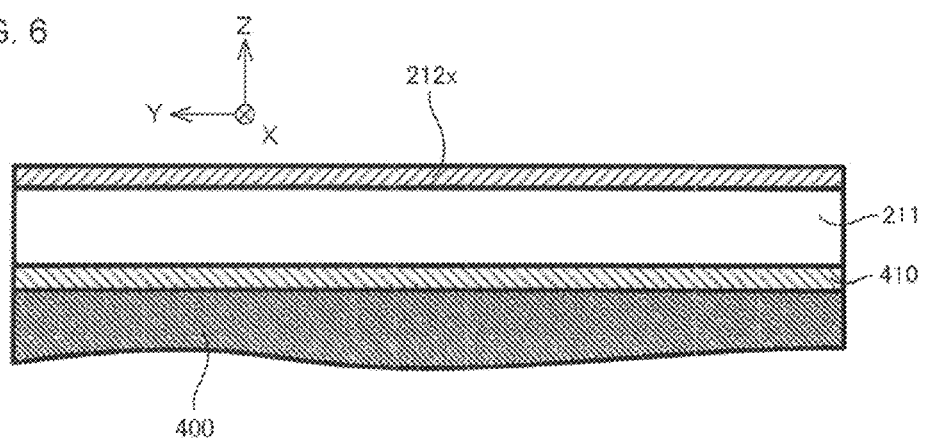
FIG. 6 is a diagram illustrating a process for forming a support layer and a conductive layer on the support body in the manufacturing method of FIG. 4.

Subsequently, as illustrated in FIG. 6, a resin layer having, for example, a metal foil is laminated on the copper foil 410 of the support body 400. Subsequently, for example, copper plating is formed by performing electrolytic plating by using the metal foil as a seed layer with a plating solution. In addition, the resin layer is thermally cured. As a result, the support layer 211 including the cured resin layer and the conductive layer (212x) including the metal foil and the copper plating are formed. This support layer 211 may include a core material such as glass cloth.

Figure 7:
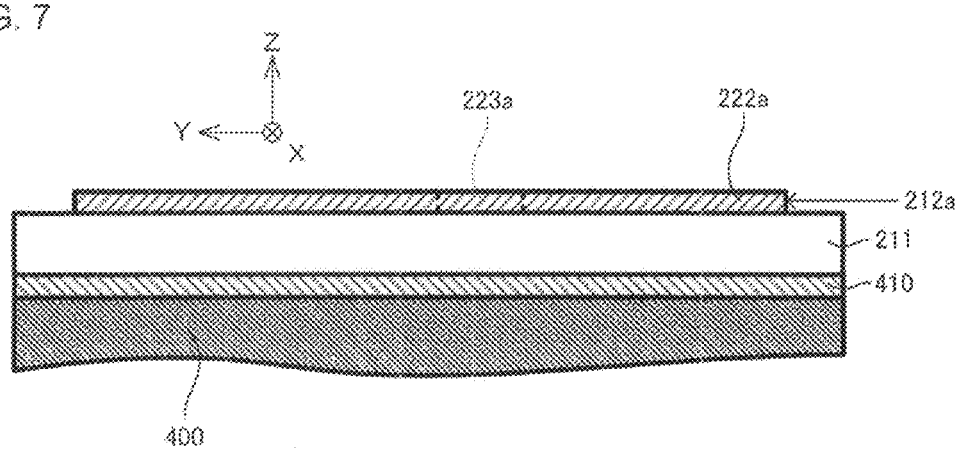
FIG. 7 is a diagram illustrating a process for forming a first inductor pattern in the manufacturing method of FIG. 4.

Subsequently, in Step (S2) of FIG. 4, for example, the conductive layer (212x) is patterned using an etching resist and an etchant. Specifically, the conductive layer (212x) is covered by an etching resist having a pattern corresponding to the first inductor pattern (212a). In addition, a portion of the conductive layer (212x) that is not covered by the etching resist (portion exposed from the opening of the etching resist) is removed through etching. As a result, as illustrated in FIG. 7, the first inductor pattern (212a) is formed on the support layer 211. In addition, the etching may be performed by dry etching and is not limited to wet etching.

In this way, the first inductor pattern (212a) includes a metal foil and a plated film on the metal foil. As a result, a thickness of the first inductor pattern (212a) suitable for obtaining inductor characteristics (Q-values) is achieved.

As illustrated in FIG. 3A, the first inductor pattern (212a) has the first output pad (223a) at one end. The first inductor pattern (212a) has the first input pad (222a) at the other end. The first inductor pattern (212a) has a turn portion (shaped approximately like a rectangle) having an internal area. The first input pad (222a) and the first output pad (223a) are extracted to the outside of the turn portion.

Subsequently, in Step (S3) of FIG. 4, the magnetic paste (213x) is coated. Specifically, as illustrated in FIG. 8, the magnetic paste (231x) is coated on the first inductor pattern (212a) and the support layer 211. As a result, an uncured portion of the magnetic paste (213x) intrudes into a portion where the first inductor pattern (212a) is not formed and into the internal area of the turn portion of the first inductor pattern (212a). It is thought that inductance increases as the amount of the magnetic material filled in the internal area of the turn portion of the first inductor pattern (212a) increases. The magnetic paste (213x) may be coated, for example, through screen printing, spray coating, roll coating, laminating and the like. Then, the magnetic paste (213x) is thermally cured so that the magnetic material layer (213a) is formed as illustrated in FIG. 9.

Here, since the first input pad (222a) and the first output pad (223a) are extracted to the outside of the turn portion as illustrated in FIG. 3A, the first and second portions (212aa, 212ab) of the first inductor pattern (212a) are partitioned along a single straight line. As a result, the magnetic paste (213x) is easy to apply. In addition, the magnetic paste (213x) is applied in a single application. Meanwhile, the planar shape of the outer edge of the turn portion included in the first portion (212aa) of the first inductor pattern (212a) is approximately rectangular. As a result, the area of the turn portion covered by the magnetic material layer (213a) increases, compared with a case where the planar shape of the outer edge of the turn portion is approximately circular. In addition, the amount of the magnetic material filled in the internal area of the turn portion of the first inductor pattern (212a) also increases, compared with a case where the planar shape of the outer edge of the turn portion is approximately circular. For this reason, it is thought that the effect of improving inductance using the magnetic material layer (213a) is enhanced, compared with a case where the planar shape of the outer edge of the turn portion is approximately circular.

Subsequently, in Step (S4) of FIG. 4, the resin layer 214 is laminated and pressed. Specifically, as illustrated in FIG. 9, for example, a resin layer 214 having a metal foil 225 is laminated on the magnetic material layer (213a), the first inductor pattern (212a) and the support layer 211. For example, the resin layer 214 is made of epoxy resin. In addition, the resin layer 214 having the metal foil 225 is pressed and crimped to the magnetic material layer (213a), the first inductor pattern (212a) and the support layer 211. Then, the resin layer 214 is thermally cured. As a result, the resin layer 214 having the metal foil 225 is laminated as illustrated in FIG. 10.

Here, the metal foil 225 may be omitted. In this case, the conductive layer and the second inductor pattern are formed on the resin layer 214, for example, through a semi-additive method.

Figure 11:
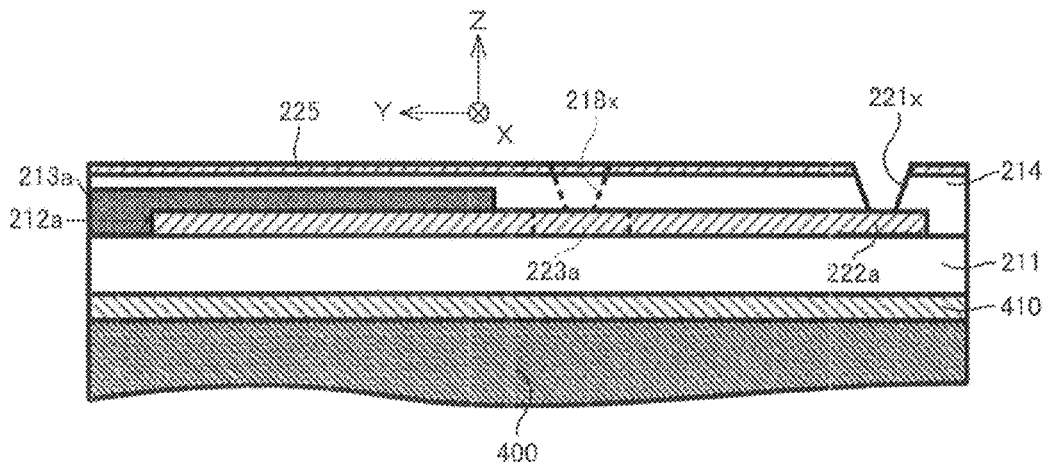
FIG. 11 is a diagram illustrating a process for forming a hole (via hole) in the resin layer in the manufacturing method of FIG. 4.

Subsequently, in Step (S5) of FIG. 4, the via conductors (218a, 221a) and the conductive layer (212y) are formed. Specifically, as illustrated in FIG. 11, the holes (218x, 221x) (via hole) are formed in the resin layer 214 and the metal foil 225, for example, using a laser. The holes (218x, 221x) penetrate through the metal foil 225 and the resin layer 214. The hole (221x) reaches the first input pad (222a) of the first inductor pattern (212a). The hole (218x) reaches the first output pad (223a) of the first inductor pattern (212a). Then, desmearing is performed as necessary.

Subsequently, for example, an electroless copper-plated film is formed inside the holes (218x, 221x) and on the metal foil 225, for example, through a chemical plating method. Before the electroless plating, a catalyst such as palladium is adsorbed onto the surfaces of the holes (218x, 221x), for example, through immersion.

Figure 12:
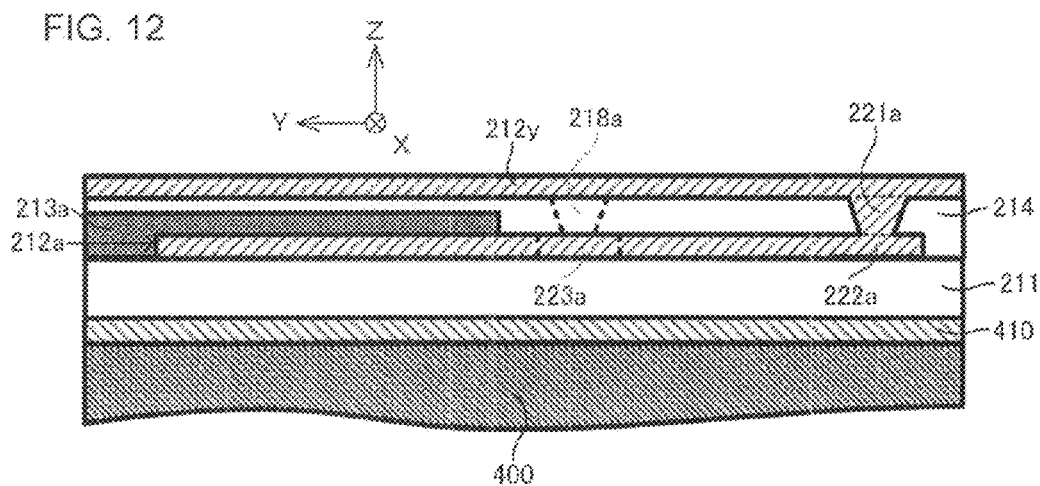
FIG. 12 is a diagram illustrating a process for forming a via conductor and a conductive layer in the manufacturing method of FIG. 4.

Subsequently, for example, electrolytic copper-plated film is formed on the electroless plated film. As a result, as illustrated in FIG. 12, the electrolytic plating is filled in the holes (218x, 221x) so that the via conductors (218a, 221a) made of, for example, copper plating, are formed. In addition, the conductive layer (212y) is formed on the resin layer 214.

Figure 13:
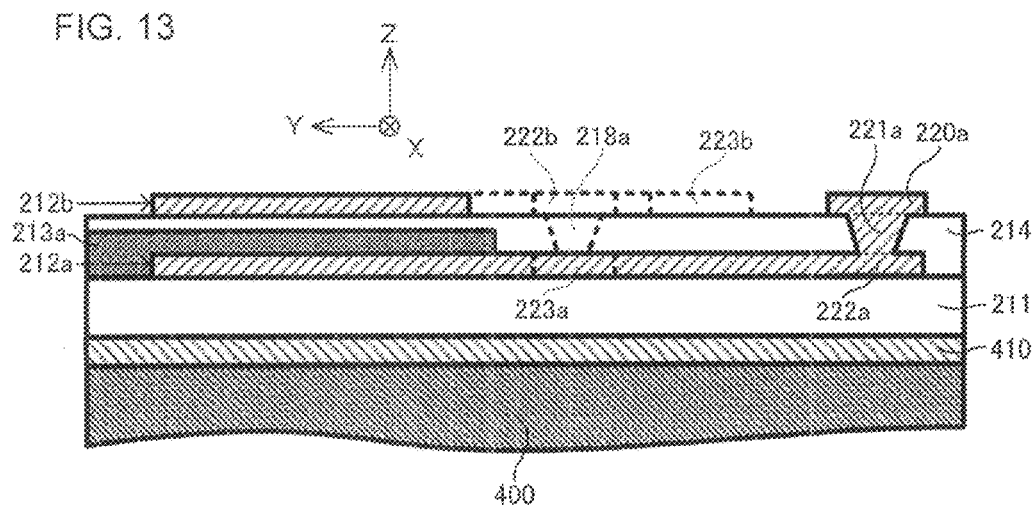
FIG. 13 is a diagram illustrating a process for forming a second inductor pattern in the manufacturing method of FIG. 4.

Subsequently, in Step (S6) of FIG. 4, the conductive layer (212y) is patterned using, for example, an etching resist and an etchant. Specifically, the conductive layer (212y) is covered by an etching resist having a pattern corresponding to the second inductor pattern (212b) and the laminated pad (220a). In addition, a portion of the conductive layer (212y) that is not covered by the etching resist (portion exposed from the opening of the etching resist) is removed through etching. As a result, as illustrated in FIG. 13, the second inductor pattern (212b) and the laminated pad (220a) are formed on the resin layer 214. The etching may be performed by dry etching and is not limited to wet etching.

In this way, the second inductor pattern (212b) is formed from a metal foil and a plated film on the metal foil. As a result, a thickness of the second inductor pattern (212b) suitable for obtaining inductor characteristics (Q-values) is achieved.

The second inductor pattern (212b) has a second output pad (223b) at one end. The second inductor pattern (212b) has a second input pad (222b) at the other end. As illustrated in FIG. 3B, the second inductor pattern (212b) has a turn portion (shaped approximately like a rectangle) having an internal area. The second input pad (222b) and the second output pad (223b) are extracted to the outside of the turn portion.

Figure 14:
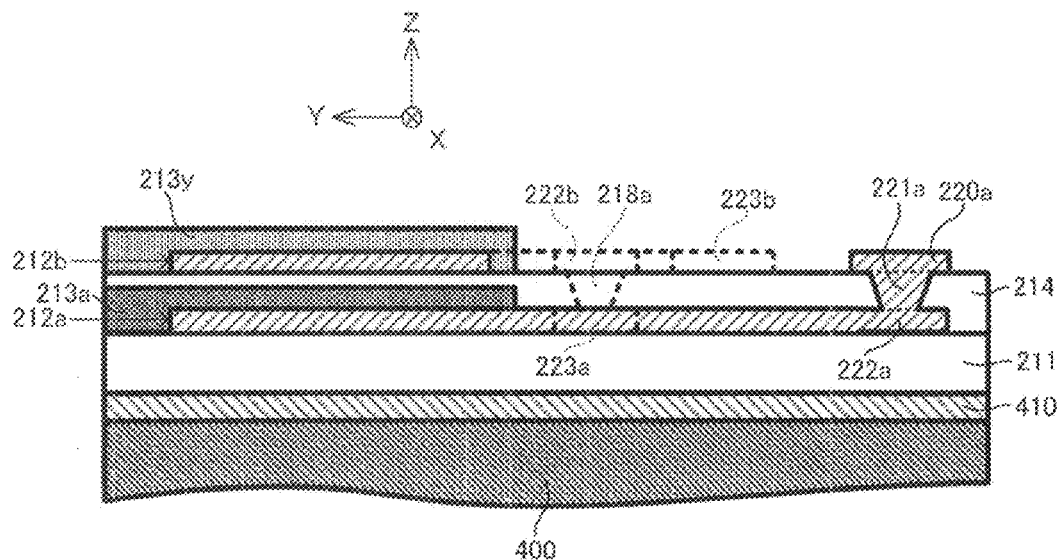
FIG. 14 is a diagram illustrating a process for forming a magnetic material layer on the second inductor pattern in the manufacturing method of FIG. 4.
Figure 15:
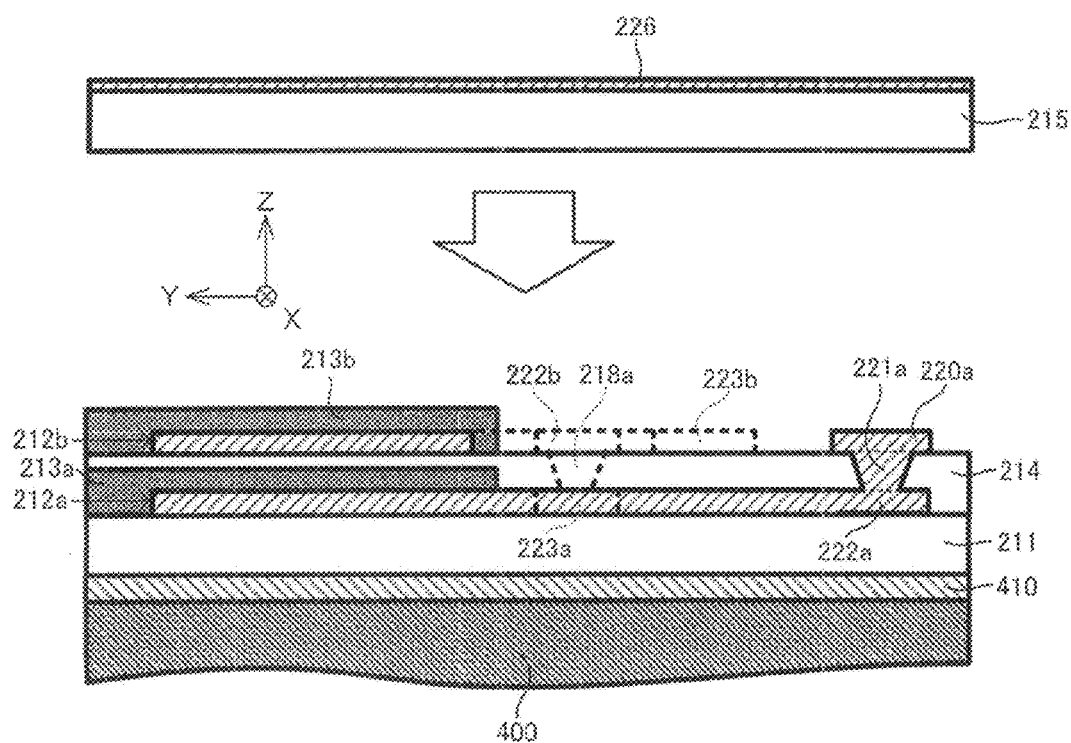
FIG. 15 is a diagram illustrating a process for laminating a resin layer on the resin layer, the second inductor pattern, and the magnetic material layer in the manufacturing method of FIG. 4.

Subsequently, in Step (S7) of FIG. 4, the magnetic paste (213y) is coated. Specifically, as illustrated in FIG. 14, the magnetic paste (213y) is coated on the second inductor pattern (212b) and the resin layer 214. As a result, an uncured portion of the magnetic paste (213y) intrudes into a portion where the second inductor pattern (212b) is not formed and into an internal area of the turn portion of the second inductor pattern (212b). It is thought that inductance increases as the amount of the magnetic material filled in the internal area of the turn portion of the second inductor pattern (212b) increases. The magnetic paste (213y) may be coated, for example, through screen printing, spray coating, roll coating, laminating and the like. Then, the magnetic paste (213y) is thermally cured so that the magnetic material layer (213b) is formed as illustrated in FIG. 15.

Here, since the second input pad (222b) and the second output pad (223b) are extracted to the outside of the turn portion as illustrated in FIG. 3B, the first and second portions (212ba, 212bb) of the second inductor pattern (212b) are partitioned along a single straight line. As a result, it is easy to apply the magnetic paste (213y). In addition, the magnetic paste (213y) is applied in a single application. Meanwhile, the planar shape of the outer edge of the turn portion included in the first portion (212ba) of the second inductor pattern (212b) is approximately rectangular. As a result, the area of the turn portion covered by the magnetic material layer (213b) increases, compared with a case where the planar shape of the outer edge of the turn portion is approximately circular. In addition, the amount of the magnetic material filled in the internal area of the turn portion of the second inductor pattern (212b) also increases, compared with a case where the planar shape of the outer edge of the turn portion is approximately circular. For this reason, it is thought that improving inductance by using the magnetic material layer (213b) has an enhanced effect, compared with a case where the planar shape of the outer edge of the turn portion is approximately circular.

Figure 16:
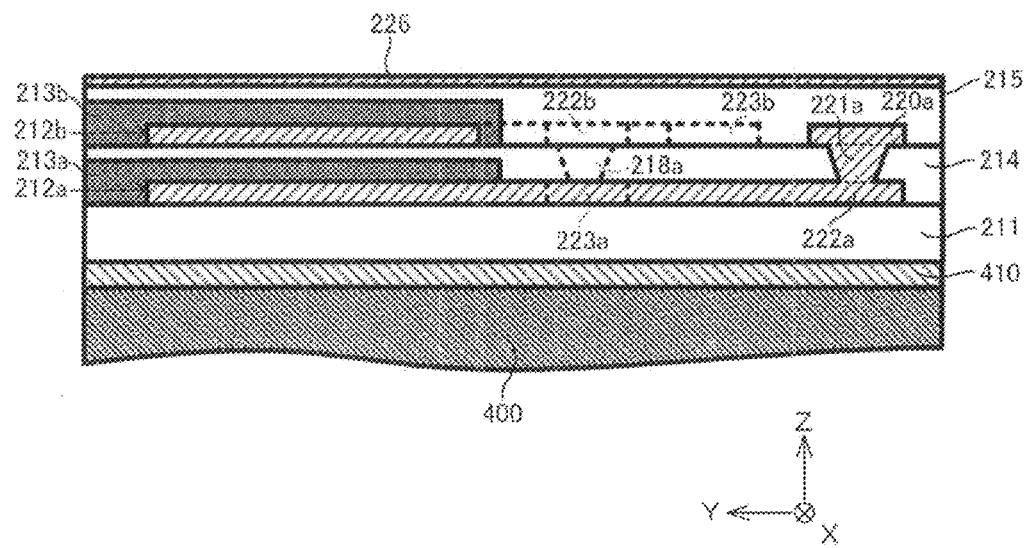
FIG. 16 is a diagram illustrating a state in which the resin layer is laminated on the resin layer, the second inductor pattern, and the magnetic material layer in the manufacturing method of FIG. 4.

Subsequently, in Step (S8) of FIG. 4, the resin layer 214 is laminated and pressed. Specifically, as illustrated in FIG. 15, for example, a resin layer 215 having a metal foil 226 is laminated on the magnetic material layer (213b), the second inductor pattern (212b) and the resin layer 214. In addition, the resin layer 215 having the metal foil 226 is pressed and crimped to the magnetic material layer (213b), the second inductor pattern (212b) and the resin layer 214. Then, the resin layer 215 is thermally cured. As a result, the resin layer 215 having the metal foil 226 is laminated as illustrated in FIG. 16.

Here, the metal foil 226 may be omitted. In this case, the conductive layer and the third inductor pattern are formed on the resin layer 215, for example, through a semi-additive method.

Figure 17:
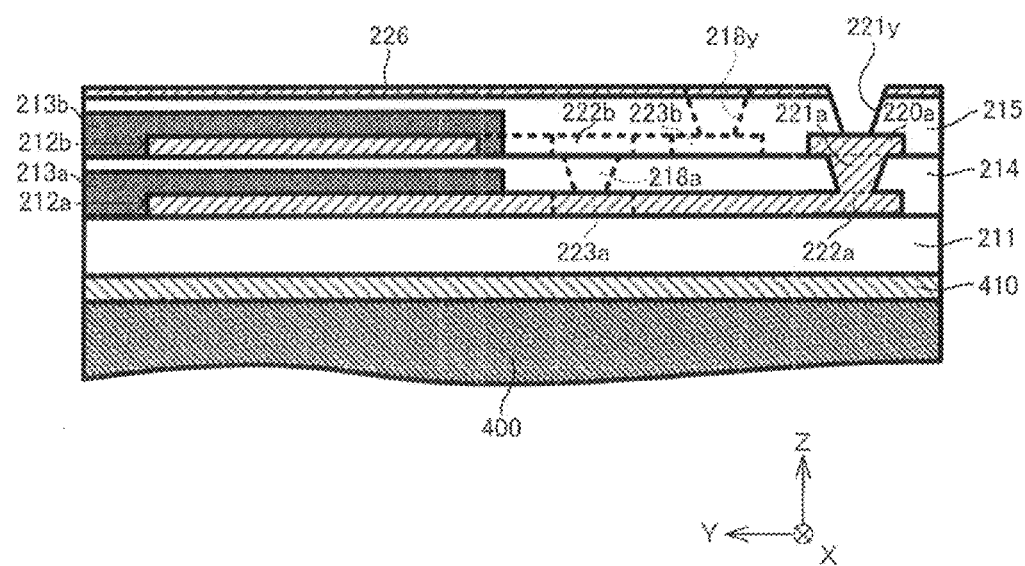
FIG. 17 is a diagram illustrating a process for forming a hole (via hole) in the resin layer in the manufacturing method of FIG. 4.

Subsequently, in Step (S9) of FIG. 4, the via conductors (218b, 221b) and the conductive layer (212z) are formed. Specifically, as illustrated in FIG. 17, the holes (218y, 221y) (via hole) are formed in the resin layer 215 and the metal foil 226, for example, using a laser. The holes (218y, 221y) penetrate through the metal foil 226 and the resin layer 215. The hole (221y) reaches the laminated pad (220a). The hole (218y) reaches the second output pad (223b) of the second inductor pattern (212b). Then, desmearing is performed as necessary.

Subsequently, for example, an electroless copper-plated film is formed inside the holes (218y, 221y) and on the metal foil 226, for example, through a chemical plating method. Before the electroless plating, a catalyst such as palladium is adsorbed onto the surfaces of the holes (218y, 221y), for example, through immersion.

Figure 18:
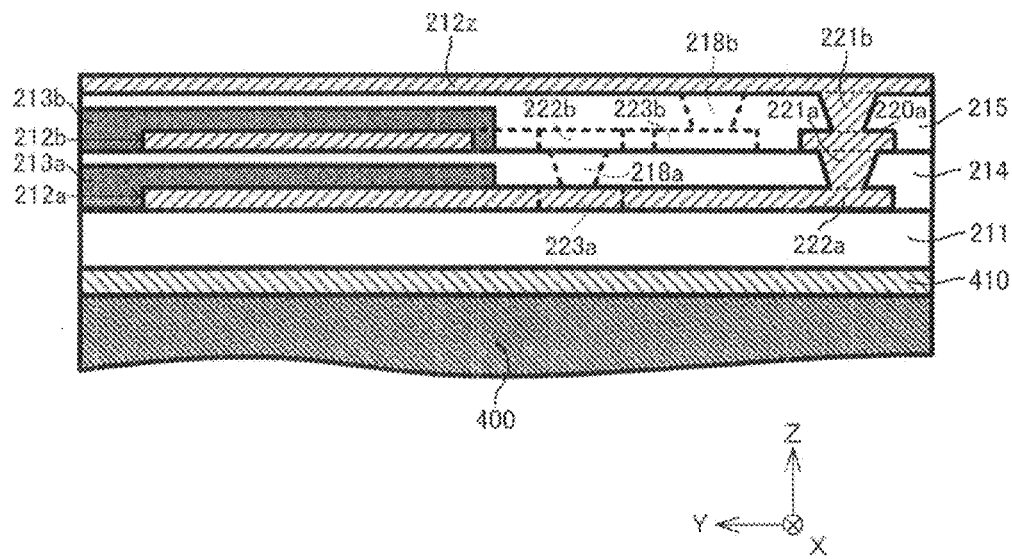
FIG. 18 is a diagram illustrating a process for forming a via conductor and a conductive layer in the manufacturing method of FIG. 4.

Subsequently, for example, electrolytic copper-plated film is formed on the electroless plated film. As a result, as illustrated in FIG. 18, the electrolytic plating is filled in the holes (218y, 221y) so that the via conductors (218b, 221b) made of, for example, copper plating are formed. In addition, the conductive layer (212z) is formed on the resin layer 215.

Figure 19:
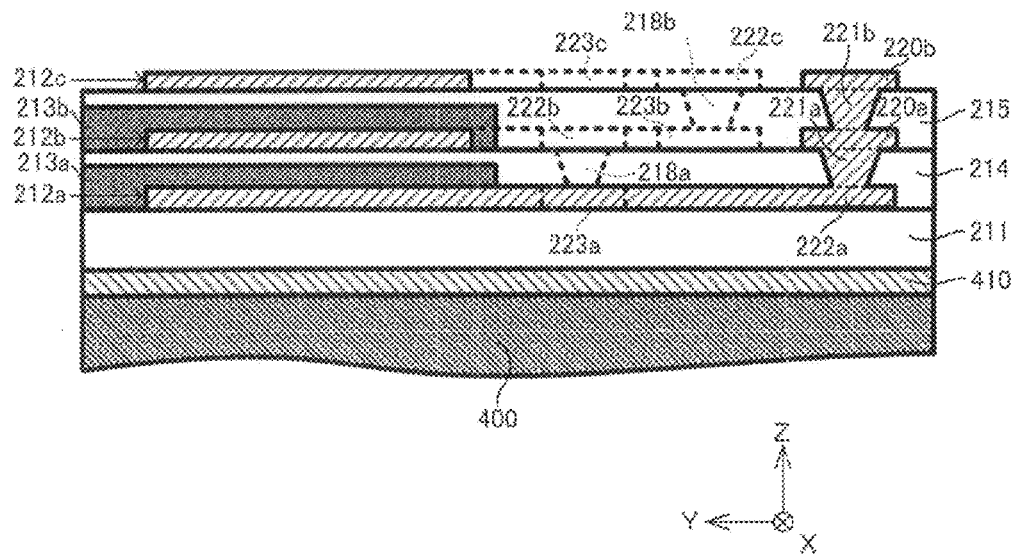
FIG. 19 is a diagram illustrating a process for forming a third inductor pattern in the manufacturing method of FIG. 4.

Subsequently, in Step (S10) of FIG. 4, the conductive layer (212z) is patterned, for example, using an etching resist and an etchant. Specifically, the conductive layer (212z) is covered by an etching resist having a pattern corresponding to the third inductor pattern (212c) and the laminated pad (220b). In addition, a portion of the conductive layer (212z) that is not covered by the etching resist (portion exposed from the opening of the etching resist) is removed by etching. As a result, as illustrated in FIG. 19, the third inductor pattern (212c) and the laminated pad (220b) are formed on the resin layer 215. In addition, the etching may be performed by dry etching and is not limited to wet etching.

The third inductor pattern (212c) has a third output pad (223c) at one end. The third inductor pattern (212c) has a third input pad (222c) at the other end. As illustrated in FIG. 3C, the third inductor pattern (212c) has a turn portion (having an approximately rectangular shape) having an internal area. The third input pad (222c) and the third output pad (223c) are extracted to the outside of the turn portion.

Figure 20:
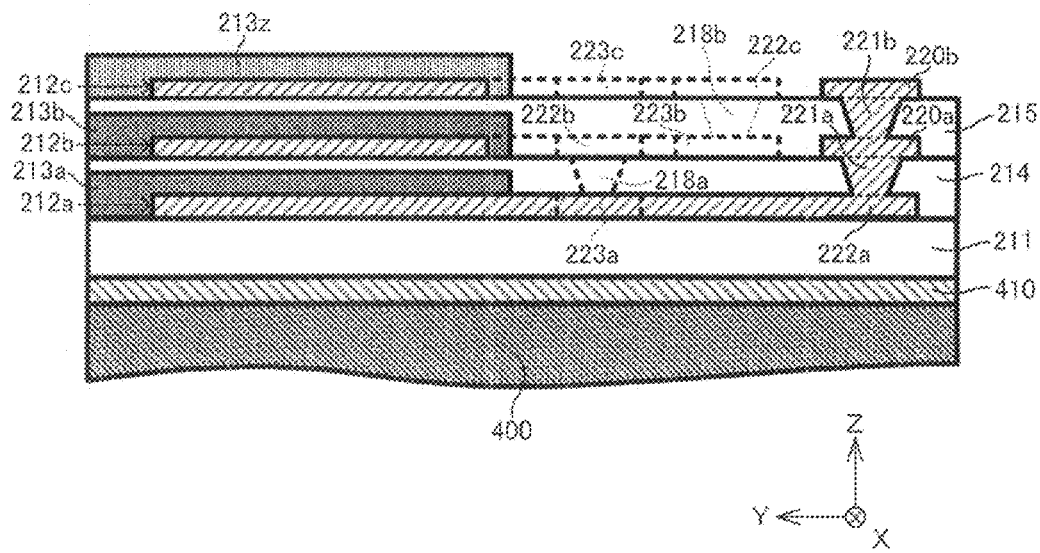
FIG. 20 is a diagram illustrating a process for forming a magnetic material layer on the third inductor pattern in the manufacturing method of FIG. 4.
Figure 21:
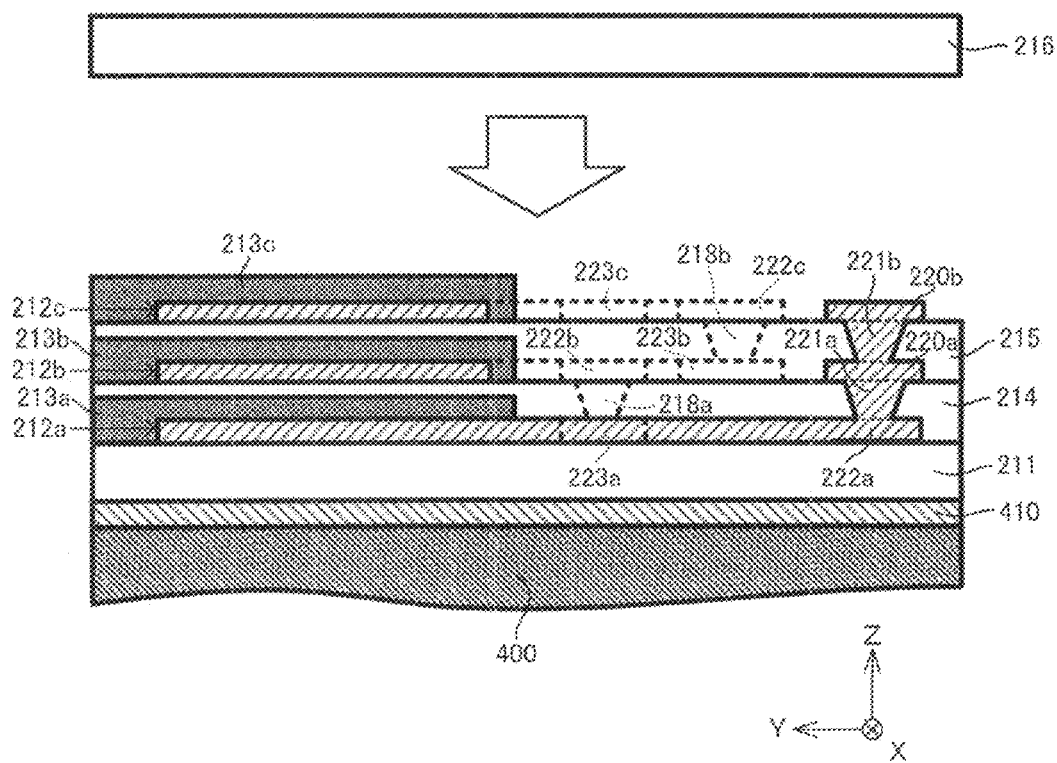
FIG. 21 is a diagram illustrating a process for laminating a resin layer on the resin layer, the third inductor pattern, and the magnetic material layer in the manufacturing method of FIG. 4.

Subsequently, in Step (S11) of FIG. 4, the magnetic paste (213z) is coated again. Specifically, as illustrated in FIG. 20, the magnetic paste (213z) is coated on the third inductor pattern (212z) and the resin layer 215. As a result, an uncured portion of the magnetic paste (213z) intrudes into a portion where the third inductor pattern (212c) is not formed and the internal area of the turn portion of the third inductor pattern (212c). It is thought that inductance increases as the amount of the magnetic material filled in the internal area of the turn portion of the third inductor pattern (212c) increases. The magnetic paste (213z) may be coated, for example, through screen printing, spray coating, roll coating, laminating and the like. Then, the magnetic paste (213z) is thermally cured so that the magnetic material layer (213c) is formed as illustrated in FIG. 21.

Here, since the third input pad (222c) and the third output pad (223c) are extracted to the outside of the turn portion as illustrated in FIG. 3C, the first and second portions (212ca, 212cb) of the third inductor pattern (212c) are partitioned along a single straight line. As a result, it is easy to apply the magnetic paste (213z). In addition, the magnetic paste (213z) is applied in a single application. Meanwhile, the planar shape of the outer edge of the turn portion included in the first portion (212ca) of the third inductor pattern (212c) is approximately rectangular. As a result, the area of the turn portion covered by the magnetic material layer (213c) increases, compared with a case where the planar shape of the outer edge of the turn portion is approximately circular. In addition, the amount of the magnetic material filled in the internal area of the turn portion of the third inductor pattern (212c) also increases, compared with a case where the planar shape of the outer edge of the turn portion is approximately circular. For this reason, it is thought that the effect of improving inductance using the magnetic material layer (213c) is enhanced, compared with a case where the planar shape of the outer edge of the turn portion is approximately circular.

Figure 22:
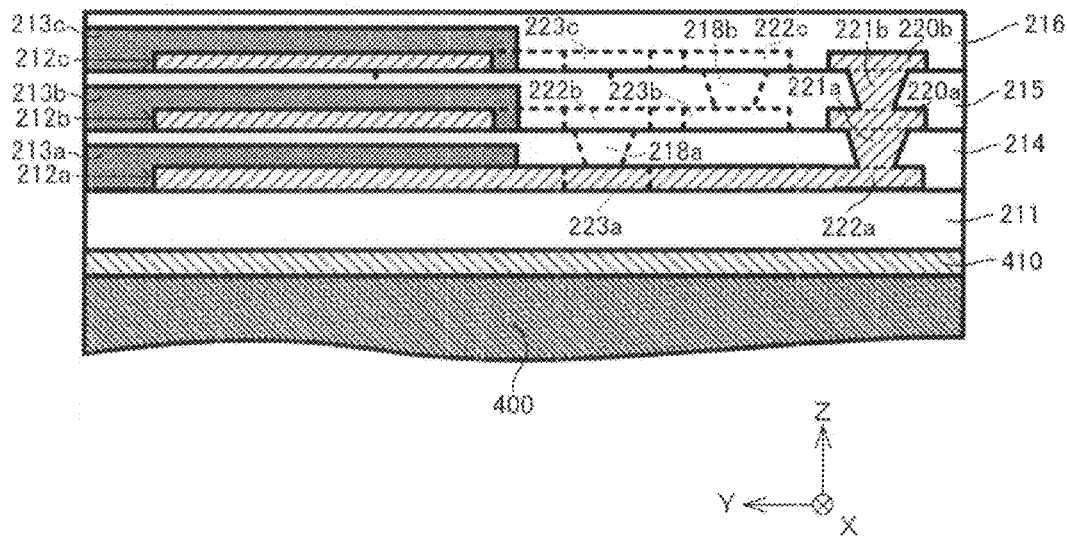
FIG. 22 is a diagram illustrating a state in which a resin layer is laminated on the resin layer, the third inductor pattern, and the magnetic material layer in the manufacturing method of FIG. 4.

Subsequently, in Step (S12) of FIG. 4, the resin layer 216 is laminated and pressed. Specifically, as illustrated in FIG. 21, a resin layer 216 is laminated on the magnetic material layer (213c), the third inductor pattern (212c) and the resin layer 215. In addition, the resin layer 216 is pressed and crimped to the magnetic material layer (213c), the third inductor pattern (212c) and the resin layer 215. Then, the resin layer 216 is thermally cured. As a result, the resin layer 216 is laminated as illustrated in FIG. 22.

Figure 23:
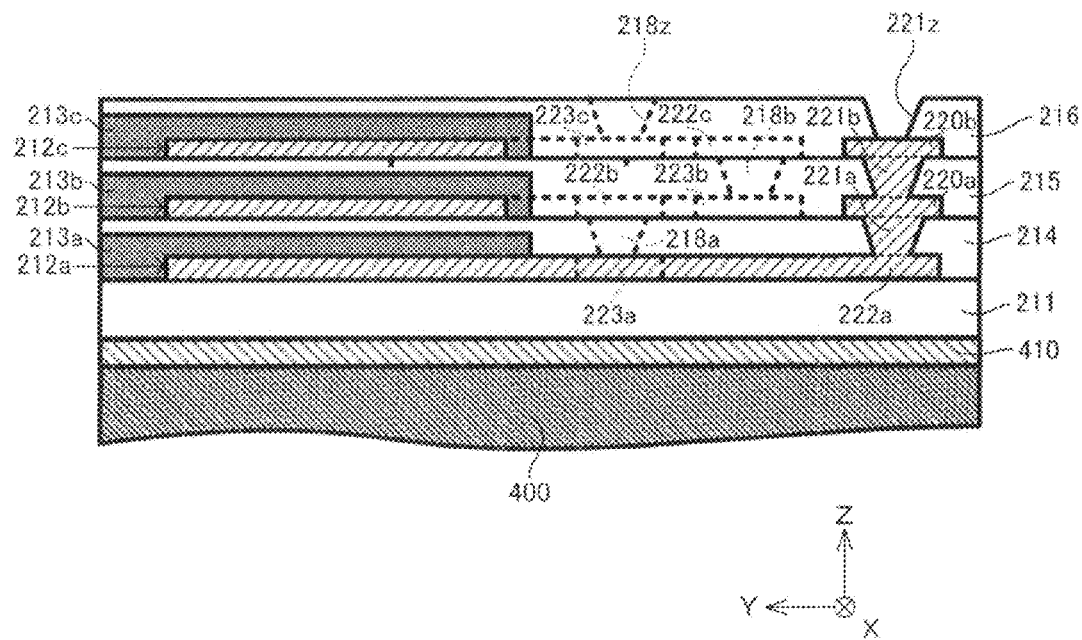
FIG. 23 is a diagram illustrating a process for forming a via hole in the resin layer in the manufacturing method of FIG. 4.

Subsequently, in Step (S 13) of FIG. 4, holes (218z, 221z) (via hole) are formed in the resin layer 216, for example, using a laser as illustrated in FIG. 23. The holes (218z, 221z)

penetrate through the resin layer 216. The hole (221z) reaches the laminated pad (220b). The hole 218z reaches the third output pad (223c) of the third inductor pattern (212c). Then, desmearing is performed as necessary.

Figure 24:
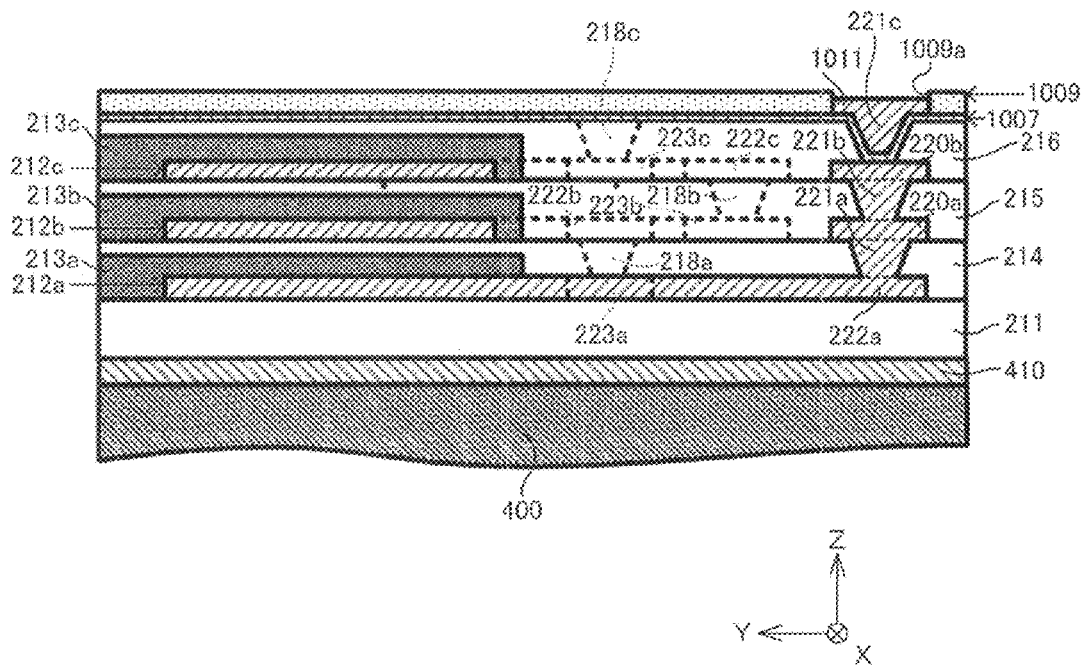
FIG. 24 is a diagram illustrating a process for forming a via conductor and a conductive layer in the manufacturing method of FIG. 4.

Subsequently, in Step (S14) of FIG. 4, the input terminal (220c) and the output terminal 219 are formed. Specifically, as illustrated in FIG. 24, an electroless plated film 1007, for example, made of copper is formed on the upper surface of the resin layer 216 including side walls of the holes (218z, 221z), for example, through a chemical plating method. In addition, before the electroless plating, a catalyst such as palladium is adsorbed onto the upper surfaces of the resin layer 216, for example, through immersion. Subsequently, a plating resist 1009 having an opening (1009a) is formed on the main surface (on the electroless plated film 1007) of the third-surface (F3) side through lithography, printing or the like. The opening (1009a) has a pattern corresponding to the input terminal (220c) and the output terminal 219 (FIG. 2).

Subsequently, electrolytic plating 1011, for example, made of copper is formed in the opening (1009a) of the plating resist 1009 as illustrated in FIG. 24, for example, through a pattern plating method. As a result, electrolytic plating 1011 is filled in each of the holes (218z, 221z) so that via conductors (218c, 221c), for example, made of copper plating are formed.

Figure 25:
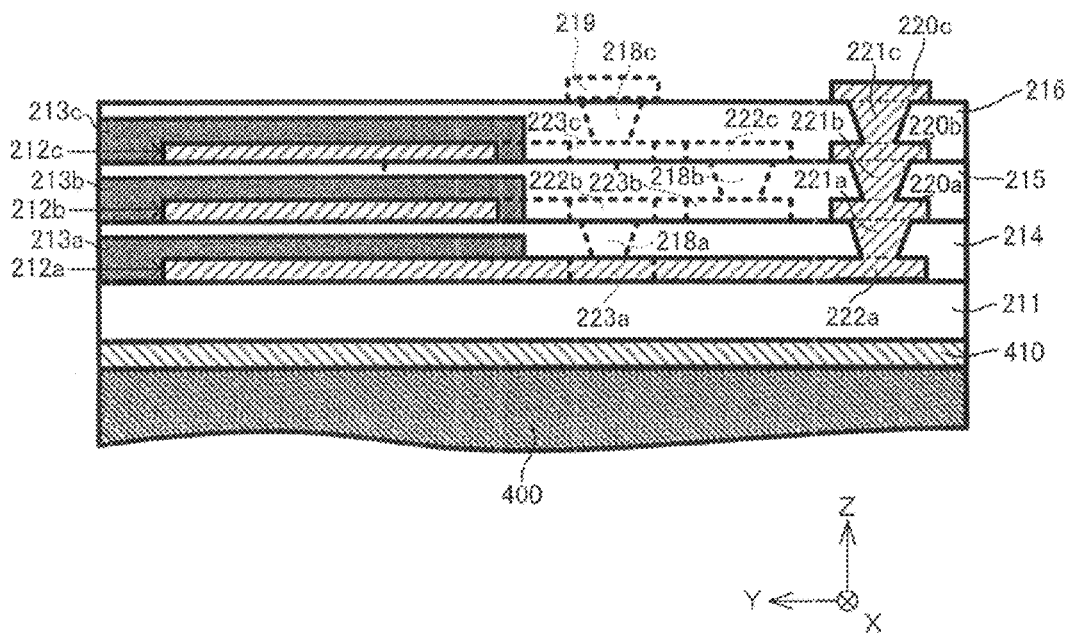
FIG. 25 is a diagram illustrating a process for forming an input terminal and an output terminal in the manufacturing method of FIG. 4.

Then, the plating resist 1009 is removed, for example, using a predetermined stripping solution. Subsequently, an undesired portion of the electroless plated film 1007 is removed. As a result, as illustrated in FIG. 25, the input terminal (220c) and the output terminal 219 are formed on the resin layer 216.

Subsequently, in step S15 of FIG. 4, the support body 400 and the copper foil 410 are removed. Specifically, first, the support body 400 is removed. Subsequently, the copper foil 410 is removed, for example, through etching. Through the aforementioned process, the inductor element 210 (FIG. 2) according to the first embodiment is obtained.

The method of manufacturing an inductor element according to the first embodiment is suitable for manufacturing the inductor element 210. It is thought that, in such a manufacturing method, an excellent inductor element 210 can be obtained at low cost.

Figure 26:
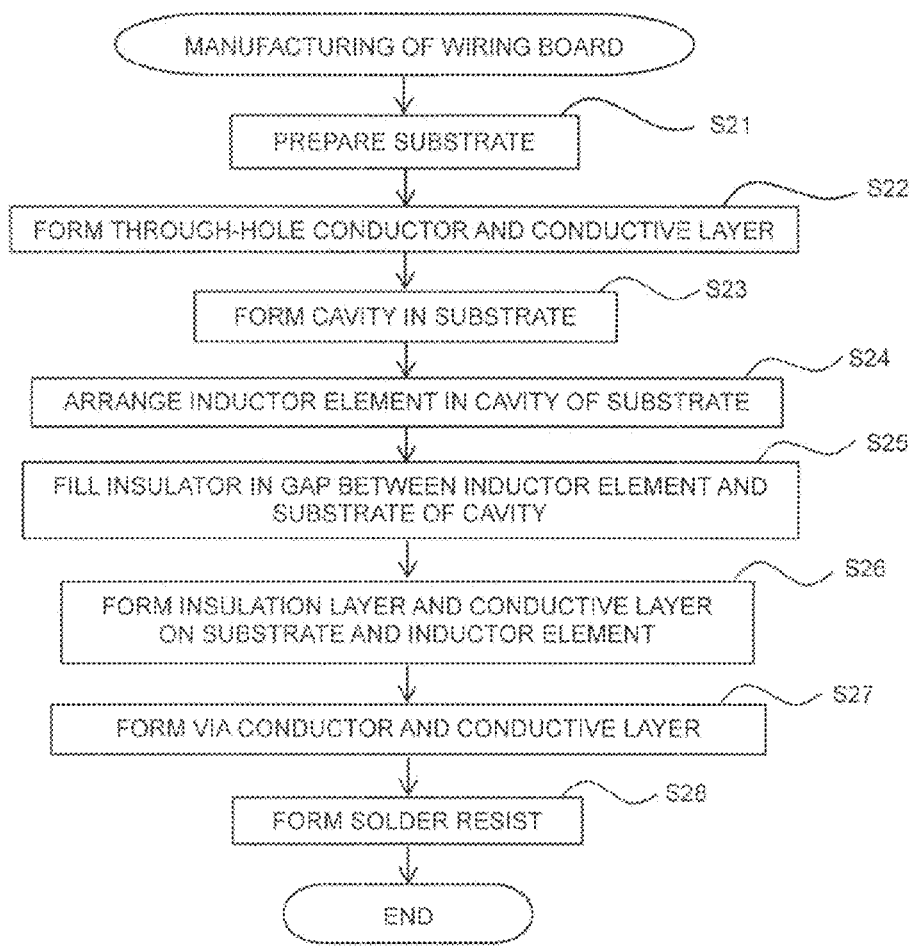
FIG. 26 is a flowchart illustrating a method of manufacturing a wiring board according to the first embodiment of the present invention.

Then, a method of manufacturing the wiring board 10 will be described with reference to FIG. 26 and the like. FIG. 26 is a flowchart schematically illustrating a method of manufacturing the wiring board 10 according to the first embodiment and a sequence thereof.

Figure 27:
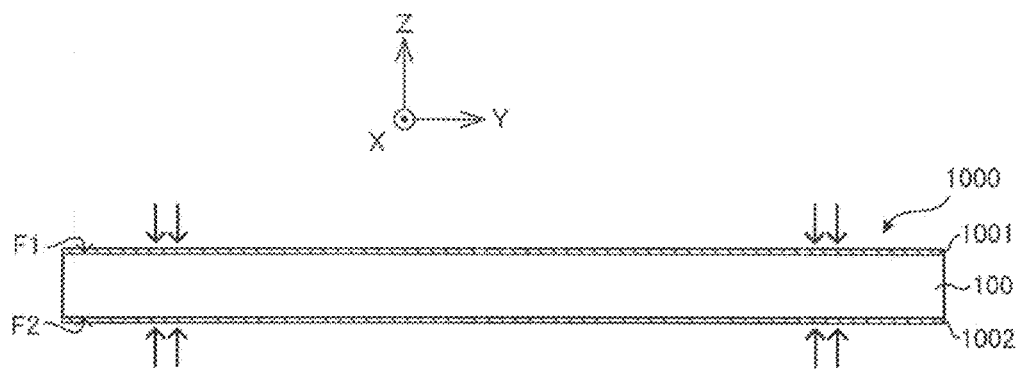
FIG. 27 is a diagram illustrating a process for providing a through hole in a substrate in the manufacturing method of FIG. 26.

In Step (S21), as illustrated in FIG. 27, a dual-side copper-clad laminate 1000 is prepared as a seed material. The dual-sided copper-clad laminate 1000 includes a substrate 100 (core substrate), a copper foil 1001 formed on the first surface (F1) of the substrate 100, and a copper foil 1002 formed on the second surface (F2) of the substrate 100. According to the first embodiment, in this step, the substrate 100 is made of perfectly solidified glass epoxy.

Subsequently, in step S22 of FIG. 26, a through-hole conductor (100b) and conductive layers (151, 152) are formed.

Figure 28:
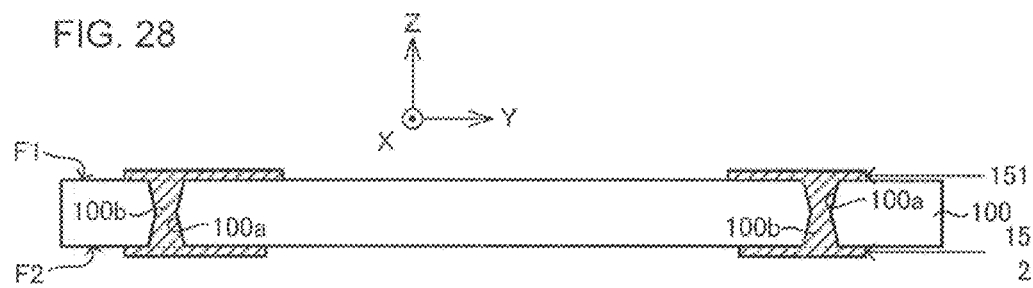
FIG. 28 is a diagram illustrating a process for forming a through-hole conductor and a conductive pattern in the manufacturing method of FIG. 26.

Specifically, as illustrated in FIG. 27, a hole is formed by irradiating a laser from the first surface (F1) side to the dual-sided copper-clad laminate 1000, for example, using a $CO_2$ laser. In addition, a hole is formed by irradiating a laser from the second-surface (F2) side to the dual-sided copper-clad laminate 1000. Such holes are formed approximately in the same position on the X-Y plane and are connected finally so that a through hole (100a) penetrating the dual-sided copper-clad laminate 1000 is formed as illustrated in FIG. 28. The laser irradiation to the first surface (F1) and the laser irradiation to the second surface (F2) may be performed either simultaneously or individually. After the through hole (100a) is formed, desmearing is preferably performed. In addition, the through hole (100a) may be formed through any method such as drilling or etching other than the laser processing. However, in the case of the laser processing, it is easy to perform minute fabrication. In particular, in a case where the diameter (maximum diameter) of the through hole (100a) is equal to or smaller than 100 μm, it is difficult to perform drilling. Therefore, the laser processing is effective.

Subsequently, as illustrated in FIG. 28, plating, for example, made of copper is formed on the copper foils (1001, 1002) and inside the through hole (100a), for example, through a panel plating method. Specifically, first, electroless plating is performed. Subsequently, plating is formed through electrolytic plating by using the electroless plated film as a seed layer and using a plating solution. As a result, the plating is filled in the through hole (100a) so that a through-hole conductor (100b) is formed.

Subsequently, each conductive layer formed in the first and second surfaces (F1) and F2 of the substrate 100 is patterned, for example, using an etching resist and an etchant. Specifically, each conductive layer is covered by an etching resist having a pattern corresponding to the conductive layers (151, 152), and a portion of each conductive layer that is not covered by the etching resist (portion exposed from the opening of the etching resist) is removed through etching. As a result, as illustrated in FIG. 28, the conductive layers (151, 152) are formed on the first and second surfaces (F1, F2), respectively, of the substrate 100. The etching may be performed by dry etching and is not limited to wet etching.

Figure 29:
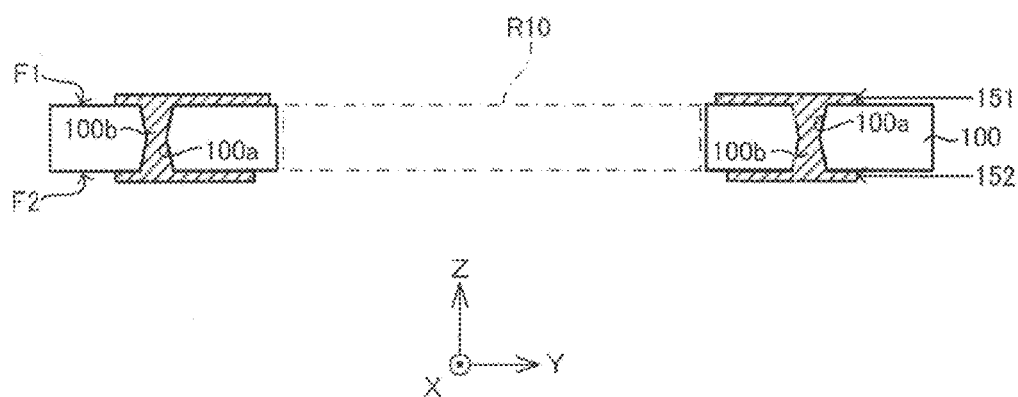
FIG. 29 is a diagram illustrating a process for forming a penetrating hole (cavity) in a core substrate in the manufacturing method of FIG. 26.

Subsequently, in Step (S23) of FIG. 26, the cavity (R10) is formed in the substrate (core substrate) 100. According to the first embodiment, the cavity (R10) is formed by irradiating a laser onto the substrate 100. Specifically, the area corresponding to the cavity (R10) is cut out from the surrounding portion of the substrate 100, for example, by irradiating a laser in a rectangular shape. A laser irradiation angle is set to be, for example, approximately perpendicular to the first surface (F1) of the substrate 100. As a result, the cavity (R10) is formed as illustrated in FIG. 29. According to the first embodiment, since the cavity (R10) is formed using a laser, it the cavity (R10) is easy to form. The cavity (R10) serves as a space for receiving the inductor element 210.

Subsequently, in Step (S24) of FIG. 26, the inductor element 210 is arranged in the cavity (R10) of the substrate 100.

Figure 30:
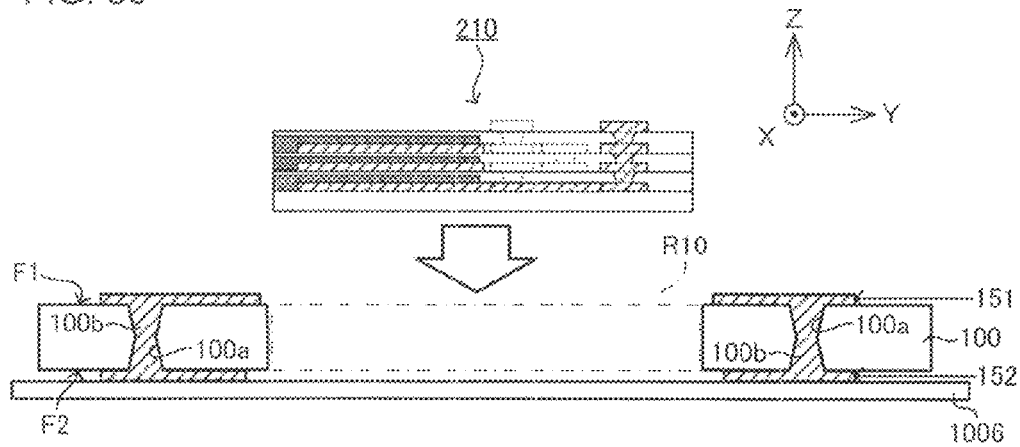
FIG. 30 is a diagram illustrating a process for arranging an inductor element in a cavity in the manufacturing method of FIG. 26.

Specifically, a carrier 1006 made of, for example, polyethylene terephthalate (PET) is provided on one side (for example, second surface (F2)) of the substrate 100 as illustrated in FIG. 30. As a result, one opening of the cavity (R10) (penetrating hole) is blocked by the carrier 1006. According to the first embodiment, the carrier 1006 is made from an adhesive sheet (for example, a bonding tape) so as to adhere to the substrate 100. The carrier 1006 is bonded to the substrate 100, for example, through lamination.

Figure 31:
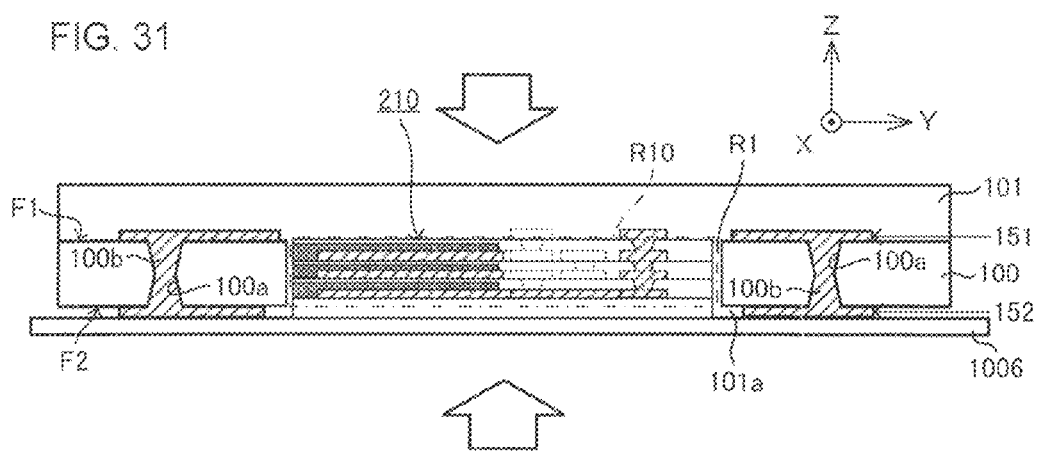
FIG. 31 is a diagram illustrating a process for filling resin in a gap between the cavity and the inductor element in the manufacturing method of FIG. 26.

Subsequently, as illustrated in FIG. 30, the inductor element 210 is inserted into the cavity (R10) from the side (+Z side) opposite the blocked opening of the cavity (R10) (penetrating hole). The inductor element 210 is inserted into the cavity (R10), for example, using a component mounting machine. For example, the inductor element 210 is held by a vacuum chuck or the like and is delivered to the upper side (+Z side) of the cavity (R10). Then, the inductor element 210 vertically drops down therefrom and is inserted into the cavity (R10). As a result, as illustrated in FIG. 31, the inductor element 210 is arranged on the carrier 1006 (adhesive sheet). In addition, in order to position the inductor element 210, an alignment mark is preferably used. It is thought that positioning accuracy between the inductor element 210 and the cavity (R10) can be improved in this manner.

Subsequently, in Step (S25) of FIG. 26, an insulator is filled in a gap between the substrate 100 of the cavity (R10) and the inductor element 210. Specifically, as illustrated in FIG. 31, the insulation layer 101 (first interlayer insulation layer) is arranged on the first surface (F1) of the substrate 100 and the third surface (F3) of the inductor element 210 on the side (+Z side) opposite the blocked opening of the cavity (R10) (penetrating hole) in a half-solidified state. The insulation layer 101 is made of, for example, epoxy resin. In addition, the insulation layer 101 may contain a core material such as glass cloth.

Subsequently, as illustrated in FIG. 31, as the insulation layer 101 is pressed in a half-solidified state, the resin overflows from the insulation layer 101 and flows into the cavity (R10). As a result, the insulator (101a) (resin of the insulation layer 101) is filled in the gap (R1) between the inductor element 210 and the substrate 100 in the cavity (R10). In this case, if the gap between the substrate 100 and the inductor element 210 is narrow, a positional deviation of the inductor element 210 or an undesirable inclination is not easily generated because the resin flows into the cavity (R10) even when fixation of the inductor element 210 is weak. In addition, the insulator (101a) has a thermal expansion coefficient higher than any one of the substrate 100 and the inductor element 210.

As the insulator (101a) is filled in the cavity (R10), the filled resin (insulator (101a)) is preliminarily adhered to the inductor element 210. Specifically, when heated, the filled resin becomes hard enough to the degree that it can hold the inductor element 210. As a result, the inductor element 210, which has been supported by the carrier 1006, is now supported by the filled resin. Then, the carrier 1006 is removed.

In this step, the insulator (101a) (filled resin) and the insulation layer 101 are just half-solidified and are not completely solidified. However, they are not limited to that, and, for example, the insulator (101a) and the insulation layer 101 may be completely solidified in this step.

Subsequently, in step S26 of FIG. 26, a build-up process is performed on the second-surface (F2) side of the substrate 100.

Figure 32:
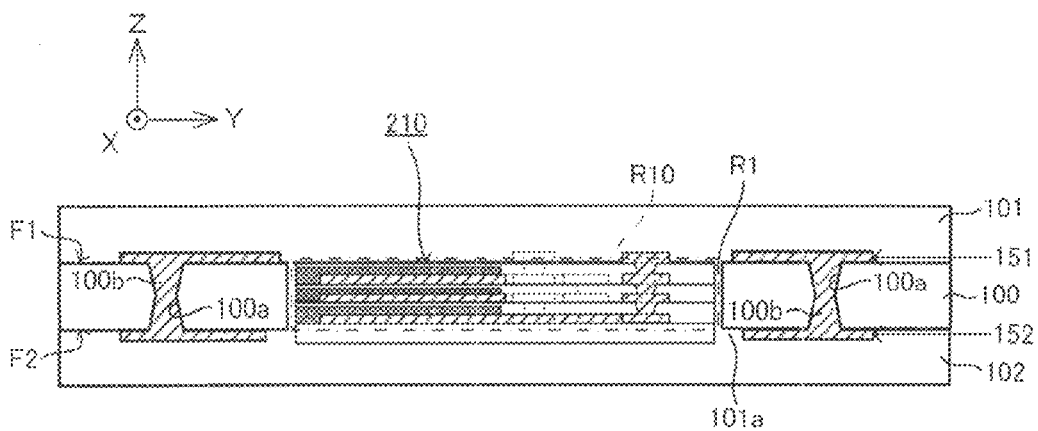
FIG. 32 is a diagram illustrating a process for forming an interlayer insulation layer on both sides of the substrate in the manufacturing method of FIG. 26.

Specifically, as illustrated in FIG. 32, the insulation layer 102 (second interlayer insulation layer) is arranged on the second surface (F2) of the substrate 100. For example, the insulation layer 102 is made of epoxy resin. Subsequently, the insulation layer 102 is bonded to the substrate 100 and the inductor element 210 in a half-solidified state, for example, by pressing, and each of the insulation layers (101, 102) is then solidified by heating. According to the first embodiment, the resin filled in the cavity R10 is solidified after the adhesive sheet (carrier 1006) is removed. Therefore, both insulation layers (101, 102) are solidified simultaneously. In addition, as the insulation layers (101, 102) on both sides are simultaneously solidified, bending of the substrate 100 is suppressed. Therefore, it is easy to make the substrate 100 thinner.

Subsequently, in Step (S27) of FIG. 26, the via conductor and the conductive layer are formed.

Specifically, as illustrated in FIG. 1, holes (111a, 112a) (via holes) are formed in the insulation layer 101, for example, using a laser. In addition, a hole (122a) (via hole) is formed in the insulation layer 102. Each of the holes (111a, 112a) penetrates through the insulation layer 101, and the hole (122a) penetrates through the insulation layer 102. In addition, the hole (111a) reaches the input terminal (220c) and the output terminal 219 of the inductor element 210, and each of the holes (112a, 122a) reaches the through-hole conductor (100b). Then, desmearing is performed as necessary.

Subsequently, as illustrated in FIG. 1, an electroless plated film, for example, made of copper is formed on the surfaces of the insulation layers (101, 102) including side walls of the holes (111a, 112a, 122a), for example, using a chemical plating method. In addition, before the electroless plating, a catalyst such as palladium is adsorbed onto the surfaces of the insulation layers (101, 102), for example, through immersion. Subsequently, a plating resist having an opening is formed on the main surface of the first-surface (F1) side, and a plating resist having an opening is formed on the main surface of the second-surface (F2) side through lithography, printing or the like. The opening has a pattern corresponding to the conductive layers (110, 120).

Subsequently, electrolytic plating, for example, made of copper is formed in the opening of the plating resist, for example, through a pattern plating method. As a result, electrolytic plating is filled in each of the holes (111a, 112a, 122a) so that the via conductors (111b, 112b, 122b), for example, made of copper plating are formed. Then, the plating resist is removed, for example, using a predetermined stripping solution. Subsequently, an undesired portion of the electroless plated film is removed. As a result, as illustrated in FIG. 1, the conductive layers (110, 120) are formed. The present invention is not limited to the electroless plated film as a seed layer for electrolytic plating. Instead of the electroless plated film, a sputtering film or the like may be used as a seed layer.

Subsequently, in Step (S28) of FIG. 26, the solder resist 11 having the opening (11a) and the solder resist 12 having the opening (12a) are formed on the insulation layers (101, 102), respectively. As illustrated in FIG. 1, the conductive layers (110, 120) are covered by the solder resists (11, 12), respectively, excluding a predetermined portion (such as pads (P1, P2) and a land) positioned in the openings (11a, 12a), respectively. The solder resists (11, 12) may be formed, for example, through screen printing, spray coating, roll coating, lamination or the like.

Subsequently, as illustrated in FIG. 1, an anti-corrosion film, for example, made of Ni/Au film is formed on the conductive layers (110, 120), specifically, on the surfaces of the pads (P1, P2) that are not covered by the solder resists (11, 12), respectively. In addition, an anti-corrosion layer made from an organic protection film may be formed through OSP treatment.

In this manner, a first build-up portion (B 1) including the insulation layer 101 and the conductive layer 110 is formed on the first surface (F1) of the substrate 100. In addition, a second build-up portion (B2), including the insulation layer 102 and the conductive layer 120, is formed on the second surface (F2) of the substrate 100. As a result, as illustrated in FIG. 1, the wiring board 10 according to the first embodiment is completed. Then, an electrical test (regarding inductance, a Q-value, insulation and the like) of the inductor element 210 is performed as necessary.

The manufacturing method of the first embodiment is suitable for manufacturing of the wiring board 10. In such a manufacturing method, it is thought that an excellent wiring board 10 can be obtained at low cost. The wiring board 10 according to the first embodiment can be electrically connected to, for example, an electronic component or another wiring board. An electronic component (such as an IC chip) may be mounted on the pad (P2) of the wiring board 10, for example, through soldering or the like. In addition, the wiring board 10 may be mounted on another wiring board (such as a main board) using the pad (P1). For example, the wiring board 10 according to the first embodiment may be employed as a circuit board of a mobile phone.

Next, a structure of an inductor element 350 according to a modification of the first embodiment will be described with reference to FIGS. 33A, 33B, 33C and 33D.

Figure 33B:
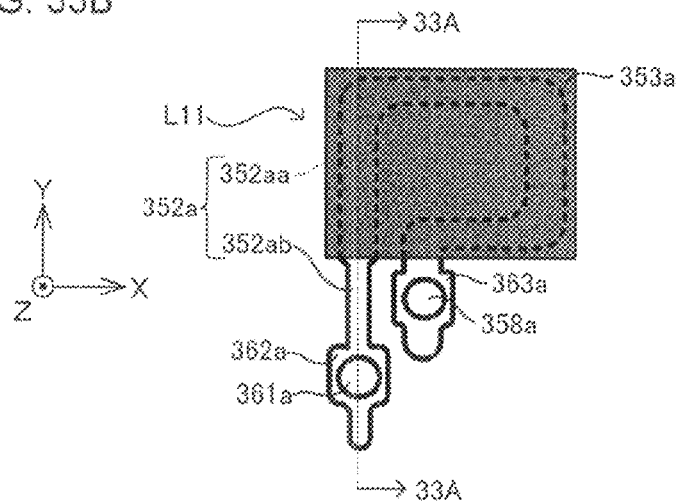
FIG. 33B is a plan view illustrating a first layer of the inductor element according to a modification of the first embodiment of the present invention.
Figure 33C:
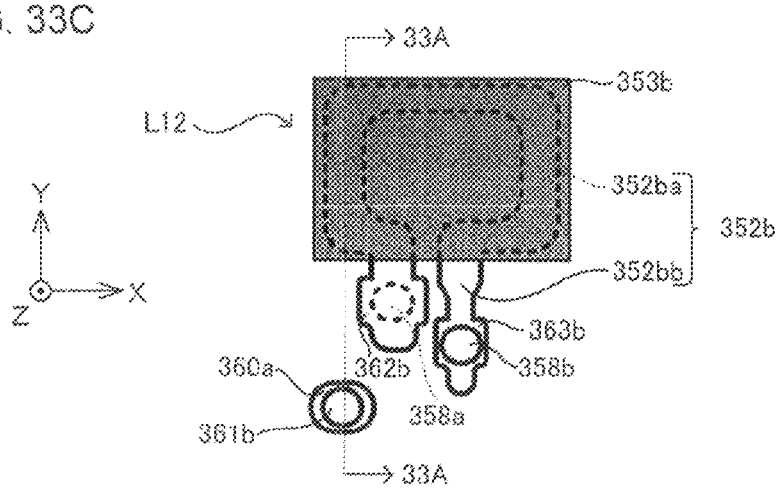
FIG. 33C is a plan view illustrating a second layer of the inductor element according to a modification of the first embodiment of the present invention.
Figure 33D:
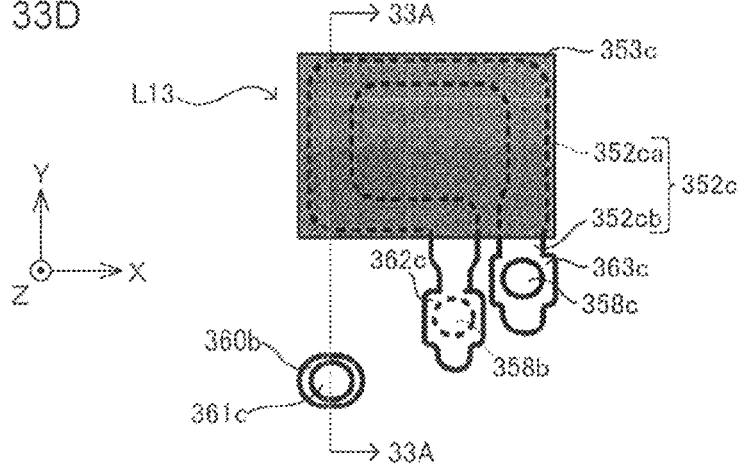
FIG. 33D is a plan view illustrating a third layer of the inductor element according to a modification of the first embodiment of the present invention.

FIG. 33A is a cross-sectional view illustrating the inductor element 350 according to a modification of the first embodiment. FIG. 33B is a schematic view illustrating a first layer (L11) of the inductor element 350 as seen from the +Z direction. FIG. 33C is a schematic view illustrating a second layer (L12) of the inductor element 350 as seen from the +Z direction. FIG. 33D is a schematic view illustrating a third layer (L13) of the inductor element 350 as seen from the +Z direction. The resin layers (354, 355, 356) are not shown in FIGS. 33B to 33D.

As illustrated in FIG. 33A, the inductor element 350 includes a support layer 351, a first layer (L11) on the support layer 351, a second layer (L12) on the first layer (L11), a third layer (L13) on the second layer (L12), and input and output terminals (360c, 359) on the third layer (L13). The inductor element 350 according to the modification is different from the inductor element 210 according to the first embodiment described above in the shape of the inductor pattern.

As illustrated in FIG. 33B, the first inductor pattern (352a) is partitioned by the first portion (352aa) indicated by the dotted line and the second portion (352ab) indicated by the solid line. The first inductor pattern (352a) has a first output pad (363a) not at one of its ends, but in the vicinity of one of its ends. The first inductor pattern (352a) has a first input pad 362 in the vicinity of the other end. A via conductor (358a) is formed on the first output pad (363a). A via conductor (361a) is formed on the first input pad (362a). A magnetic material layer (353a) is formed on the first inductor pattern (352a). The magnetic material layer (353a) contains magnetic particles and resin. As illustrated in FIG. 33A, a resin layer 354 is formed on the magnetic material layer (353a). A second inductor pattern (352b) is formed on the resin layer 354.

As illustrated in FIG. 33C, the second inductor pattern (352b) is partitioned into a first portion (352ba) indicated by the dotted line and a second portion (352bb) indicated by the solid line. Similarly, the second inductor pattern (352b) has a second input pad (362b) not at one of its ends, but in the vicinity of one of its ends. The second inductor pattern (352b) has a second output pad (363b) in the vicinity of the other end. Similarly, the third inductor pattern (352c) has a third input pad (362c) not at one of its ends, but in the vicinity of one of its ends as illustrated in FIG. 33D. The third inductor pattern (352c) has a third output pad (363c) in the vicinity of the other end.

Input and output terminals (360c, 359) are formed on the resin layer 356. The input terminal (360c) is electrically connected to the laminated pad (360b) through a via conductor (361c). The output terminal 359 is electrically connected to the third output pad (363c) through a via conductor (358c). The via conductors (358c, 361c) penetrate through the resin layer 356.

In this manner, the inductor element 350 according to a modification of the first embodiment has substantially the same structure as that of the inductor element 210 of the first embodiment described above. In addition, the inductor element 350 has substantially the same inductor characteristics as that of the inductor element 210. Similarly, the inductor element 350 may be embedded in the wiring board 10 for use.

Second Embodiment

The second embodiment of the present invention will now be described with reference to FIGS. 34A, 34B, 34C and 34D.

First, a structure of an inductor element 230 according to the second embodiment will be described with reference to FIGS. 34A, 34B, 34C and 34D.

Figure 34B:
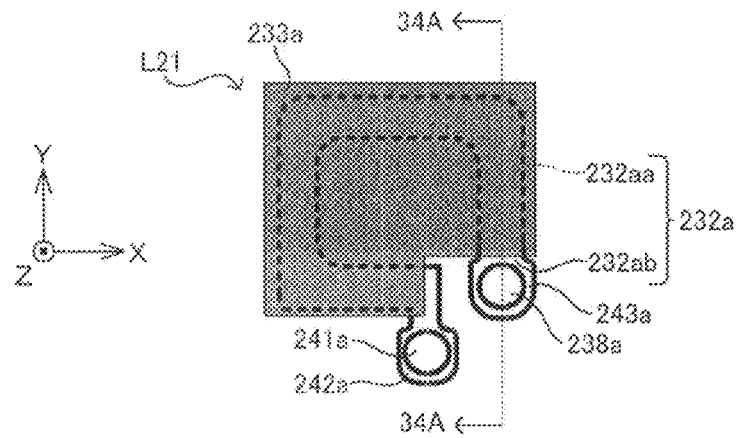
FIG. 34B is a plan view illustrating a first layer of the inductor element according to the second embodiment of the present invention.
Figure 34C:
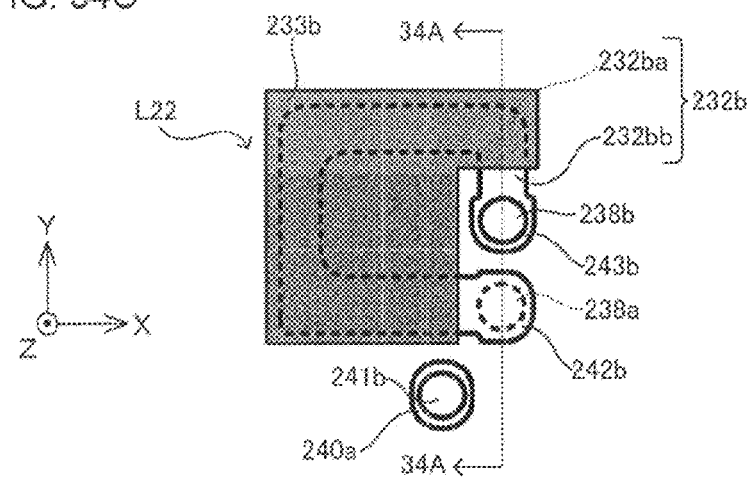
FIG. 34C is a plan view illustrating a second layer of the inductor element according to the second embodiment of the present invention.
Figure 34D:
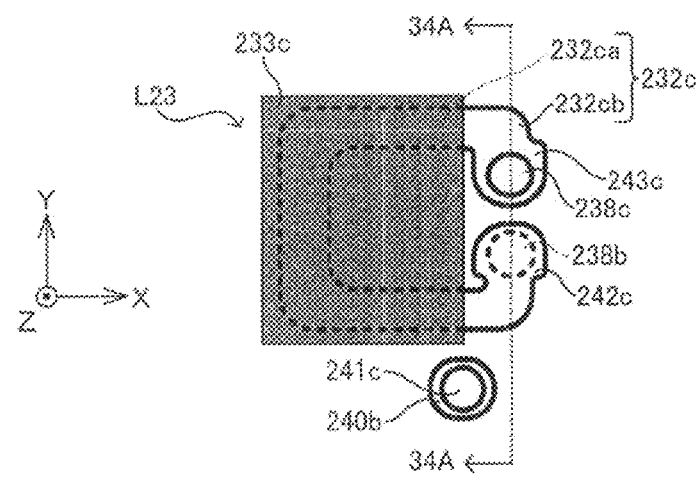
FIG. 34D is a plan view illustrating a third layer of the inductor element according to the second embodiment of the present invention.

FIG. 34A is a cross-sectional view illustrating the inductor element 230 according to the second embodiment. FIG. 34B is a schematic diagram illustrating a first layer (L21) of the inductor element 230 as seen from the +Z direction. FIG. 34C is a schematic diagram illustrating a second layer (L22) of the inductor element 230 as seen from the +Z direction. FIG. 34D is a schematic diagram illustrating a third layer (L23) of the inductor element 230 as seen from the +Z direction. The resin layers (234, 235, 236) are not shown in FIGS. 34B to 34D.

A structure of the inductor element 230 according to the second embodiment is similar to that of the inductor element 210 according to the first embodiment. The inductor element 230 is different from the inductor element 210 in a planar shape of each inductor pattern and a planar shape of each magnetic material layer.

As illustrated in FIG. 34A, the inductor element 230 includes a support layer 231, a first layer (L21) on the support layer 231, a second layer (L22) on the first layer (L21), a third layer (L23) on the second layer (L22), and input and output terminals (240c, 239) on the third layer (L23). The upper surface of the inductor element 230 will be referred to as a fifth surface (F5), and the lower surface will be referred to as a sixth surface (F6).

The first layer (L21) includes a first inductor pattern (232a), an interlayer insulation layer (237a), a via conductor (238a), and a via conductor (241a). The interlayer insulation layer (237a) includes a magnetic material layer (233a) and a resin layer 234.

The second layer (L22) includes a second inductor pattern (232b), an interlayer insulation layer (237b), a via conductor (238b) and a via conductor (241b). The interlayer insulation layer (237b) includes a magnetic material layer (233b) and a resin layer 235.

The third layer (L23) includes a third inductor pattern (232c), an interlayer insulation layer (237c), a via conductor (238c), and a via conductor (241c). The interlayer insulation layer (237c) includes the magnetic material layer (233c) and the resin layer 236 illustrated in FIG. 34D.

As illustrated in FIG. 34B, the first inductor pattern (232a) has a first portion (232aa), which overlaps the magnetic material layer (233a), and a second portion (232ab), which is the rest of first inductor pattern (232a). The first portion (232aa) is formed in a C-shape. This first portion mainly serves as an inductor. A first output pad (243a) and a first input pad (242a) are provided at respective ends of the second portion (232ab). Except for the first input pad (242a), the second portion (232ab) is not extracted to the outside of the turn portion of the first inductor pattern (232a), but is mostly included in the turn portion.

As illustrated in FIG. 34A, a magnetic material layer (233a) that covers the first portion (232aa) and a resin layer 234 that covers both the first portion (232aa) and the second portion (232ab) of the first input pad (232a) are formed on the first inductor pattern (232a). The magnetic material layer (233a) contains magnetic particles and resin. The via conductors (238a, 241a) are formed in an inner portion of the via hole provided in the resin layer 234. The via conductor (238a) is formed on the first output pad (243a). The via conductor (241a) is formed on the first input pad (242a).

As illustrated in FIG. 34A, a second inductor pattern (232b) is formed on the resin layer 234. In addition, a laminated pad (240a) is formed on the resin layer 234. The laminated pad (240a) is electrically connected to the first input pad (242a) through a via conductor (241a).

As illustrated in FIG. 34C, the second inductor pattern (232b) has a first portion (232ba), which overlaps the magnetic material layer (233b), and a second portion (232bb), which is the rest of second inductor pattern (232b). The first portion (232ba) is formed in a C-shape. The first portion mainly serves as an inductor. A first output pad (243a) and a first input pad (242a) are provided at respective ends of the second portion (232bb).

The second portion (232bb) is not extracted to the outside of the turn portion of the second inductor pattern (232b), but is included in the turn portion.

The second input pad (242b) of the second inductor pattern (232b) is electrically connected to the first output pad (243a) through a via conductor (238a). The via conductors (238a, 241a) penetrate through the resin layer 234.

As illustrated in FIG. 34A, a magnetic material layer (233b) that covers the first portion (232ba) and a resin layer 235 that covers both the first and second portions (232ba, 232bb) of the second inductor pattern (232b) are formed on the second inductor pattern (232b). The magnetic material layer (233b) contains magnetic particles and resin. The via conductors (238b, 241b) are formed inside the via-hole provided in the resin layer 235. The via conductor (238b) is formed on the second output pad (243b). The via conductor (241b) is formed on the laminated pad (240a).

As illustrated in FIG. 34A, a third inductor pattern (232c) is formed on the resin layer 235. In addition, a laminated pad (240b) is formed on the resin layer 235.

The laminated pad (240b) is electrically connected to the laminated pad (240a) through the via conductor (241b). The third input pad (242c) of the third inductor pattern (232c) is electrically connected to the second output pad (243b) through the via conductor (238b). The via conductors (238b, 241b) penetrate through the resin layer 235.

As illustrated in FIG. 34D, the third inductor pattern (232c) includes a first portion (232ca) which overlaps the magnetic material layer (233c), and a second portion (232cb) which is the rest of the third inductor pattern (232c). The first portion (232ca) is formed in a C-shape. The first portion mainly serves as an inductor. A third output pad (243a) and a third input pad (242a) are provided at respective ends of the second portion (232cb). The second portion (232cb) is not extracted to the outside of the turn portion of the third inductor pattern (232c), but is included in the turn portion.

As illustrated in FIG. 34A, a magnetic material layer (233c) that covers the first portion (232ca) and a resin layer 236 that covers both the first and second portions (232ca, 232cb) of the third inductor pattern (232c) are formed on the third inductor pattern (232c). The magnetic material layer (233c) contains magnetic particles and resin. Via conductors (238c, 241c) are formed in the inside of the via hole provided in the resin layer 236. The via conductor (238c) is formed on the third output pad (243c). The via conductor (241c) is formed on the laminated pad (240b).

Input and output terminals (240c, 239) are formed on the resin layer 236. The input terminal (240c) is electrically connected to the laminated pad (240b) through the via conductor (241c). The output terminal 239 is electrically connected to the third output pad (243c) through the via conductor (238c). The via conductors (238c, 241c) penetrate through the resin layer 236.

In this manner, the first inductor pattern (232a), the via conductor (238a), the second inductor pattern (232b), the via conductor (238b) and the third inductor pattern (232c) constitute a three-turn inductor. In addition, all of the via conductors (241a, 241b, 241c) are filled conductors and are stacked in the Z direction. Such a stacked structure is advantageous in miniaturizing the inductor element 230.

In the inductor element 230 according to the second embodiment, an electric current is input from the input terminal (240c), is conducted through a stacked structure including the via conductors (241a, 241b, 241c), and enters the first inductor pattern (232a). In addition, the electric current passes through the three-turn inductor and is output from the output terminal 239. In the inductor element 230 according to the second embodiment, the input terminal (240c) and the output terminal 239 are formed on the same surface (fifth surface F5). As a result, in a case where the inductor element 230 is incorporated in the core material of the wiring board, it is easy to provide wiring to the inductor element 230.

In the inductor element 230 according to the second embodiment, the inductor pattern is connected to a portion where no magnetic material layer is provided. As a result, in a case where the areas of the magnetic material layers are the same, an effective area of the magnetic material layer relative to the inductor pattern increases, compared with a case where the magnetic material layer has a via hole through which the inductor pattern is connected. Therefore, inductance is increased and the inductor element is made thinner without increasing the area of the magnetic material layer.

In the inductor element 230 according to the second embodiment, all of the first inductor pattern (232a), the second inductor pattern (232b) and the third inductor pattern (232c) include respective turn portions. As a result, the inductor element 230 is miniaturized even further.

A method of manufacturing the inductor element 230 according to the second embodiment is similar to the method of manufacturing the inductor element 210 of the first embodiment described above. That is, the inductor element 230 is manufactured through a sequence similar to that illustrated in FIG. 4. In addition, the inductor element 230 may be arranged inside the cavity (R10) of the wiring board 10 described above.

Third Embodiment

The third embodiment of the present invention will now be described with reference to FIGS. 35 to 41. First, a structure of an inductor element 250 according to the third embodiment will be described with reference to FIGS. 35 to 38. The inductor element 250 according to the third embodiment is structured by forming multiple inductor patterns on the same plane and laminating the inductor patterns.

Figure 36:
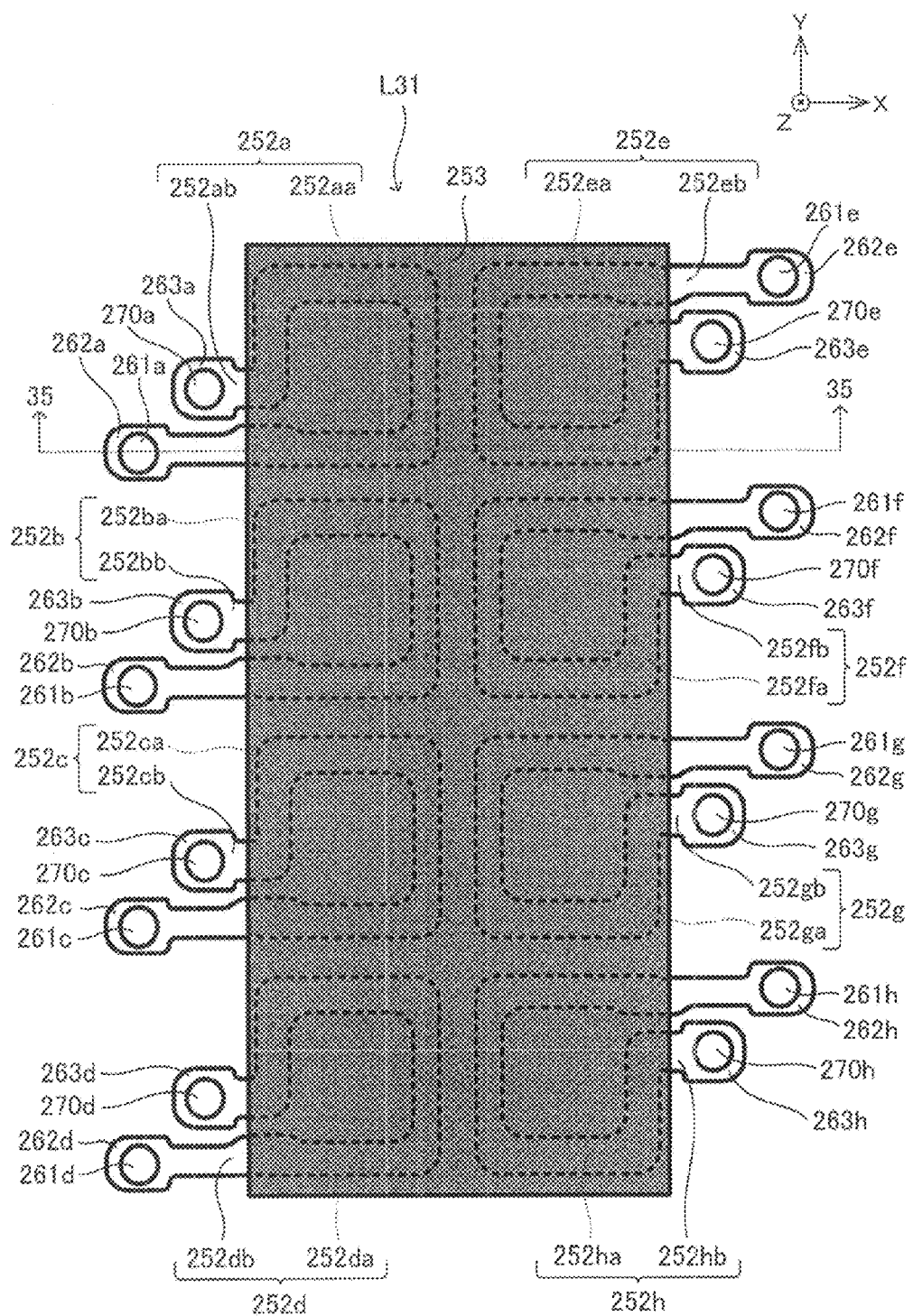
FIG. 36 is a plan view illustrating a first layer of the inductor element according to the third embodiment of the present invention.
Figure 37:
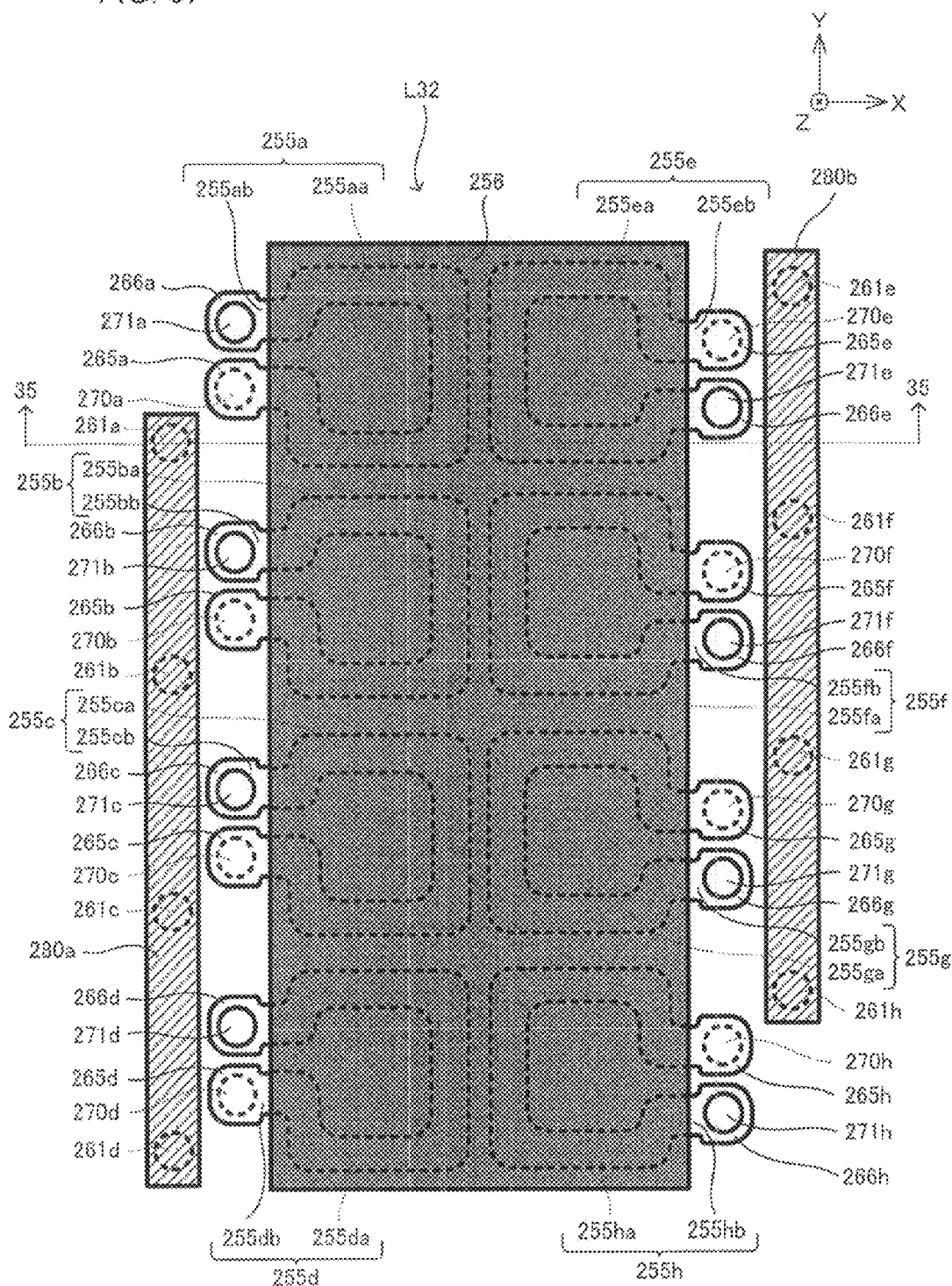
FIG. 37 is a plan view illustrating a second layer of the inductor element according to the third embodiment of the present invention.
Figure 38:
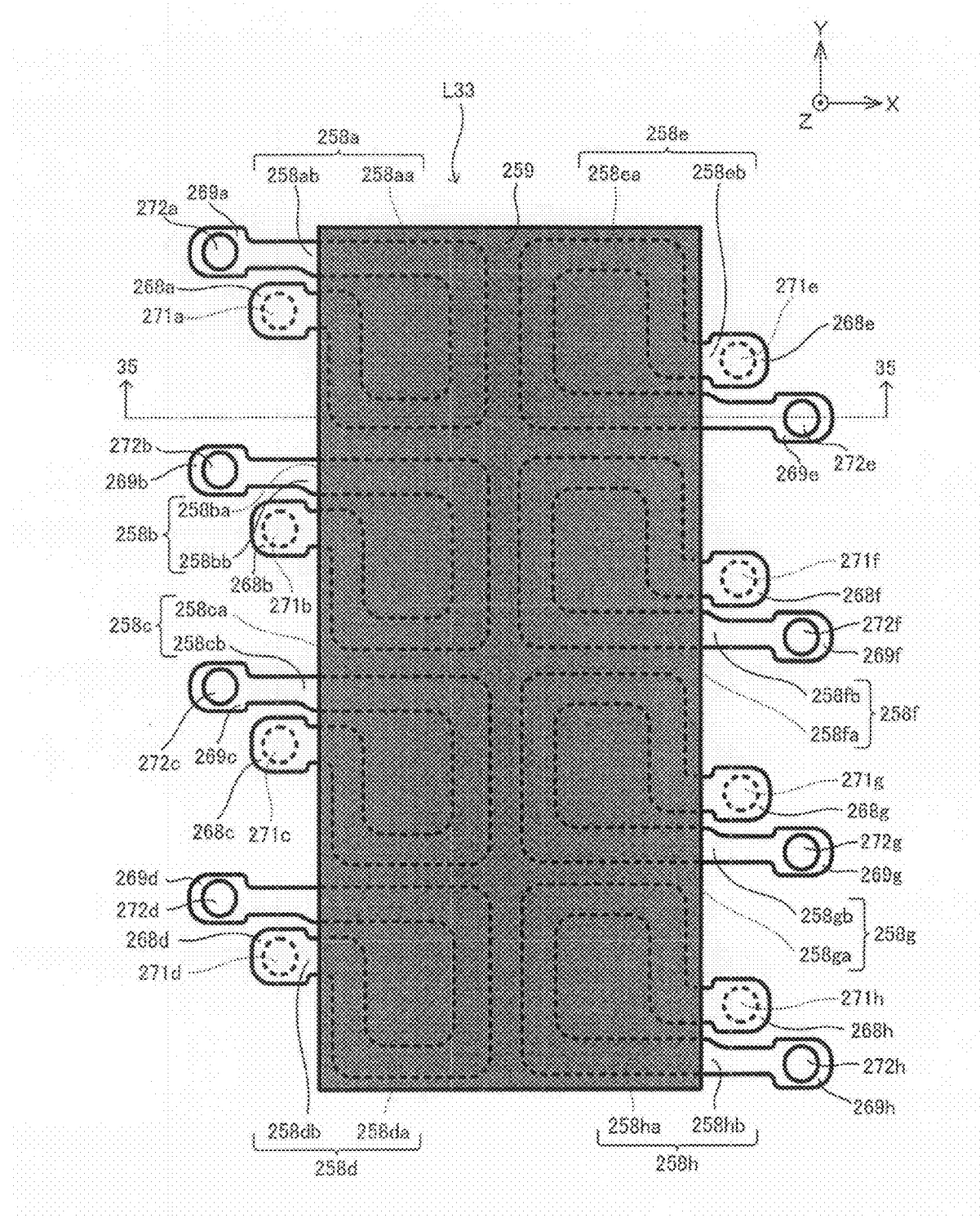
FIG. 38 is a plan view illustrating a third layer of the inductor element according to the third embodiment of the present invention.

FIG. 35 is a cross-sectional view illustrating the inductor element 250 according to the third embodiment. FIG. 36 is a schematic diagram illustrating a first layer (L31) of the inductor element 250 as seen from the +Z direction. FIG. 37 is a schematic diagram illustrating a second layer (L32) of the inductor element 250 as seen from the +Z direction. FIG. 38 is a schematic diagram illustrating a third layer (L33) of the inductor element 250 as seen from the +Z direction. The resin layers (254, 257, 260) are not shown in FIGS. 36 to 38.

As illustrated in FIG. 35, the inductor element 250 includes a support layer 251, a first layer (L31) on the support layer 251, a second layer (L32) on the first layer (L31), a third layer (L33) on the second layer (L32), and output terminals (273a to 273h) on the third layer (L33). As illustrated in FIGS. 36 to 38, each layer of the inductor element 250 has eight inductor patterns. The upper surface of the inductor element 250 will be referred to as a seventh surface (F7), and the lower surface of the inductor element 250 will be referred to as an eighth surface (F8).

As illustrated in FIGS. 35 and 36, the first layer (L31) includes eight first inductor patterns (252a to 252h), a magnetic material layer 253, a resin layer 254, eight via conductors (261a to 261h), and eight via conductors (270a to 270h).

As illustrated in FIGS. 35 and 37, the second layer (L32) includes eight second inductor patterns (255a to 255h), a magnetic material layer 256, a resin layer 257, eight via conductors (271a to 271h), and two electrodes (280a, 280b).

As illustrated in FIGS. 35 and 38, the third layer (L33) includes eight third inductor patterns (258a to 258h), a magnetic material layer 259, a resin layer 260, and eight via conductors (272a to 272h).

As illustrated in FIG. 36, the first inductor patterns (252a to 252h) have first portions (252aa to 252ha) which overlap the magnetic material layer (253a), and second portions (252ab to 252hb) which are the rest of first inductor patterns (252a to 252h) respectively. The first portions (252aa to 252ha) are formed in a C-shape. The first portions (252aa to 252ha) mainly serve as an inductor. First output pads (263a to 263h) and first input pads (262a to 262h) are provided at the respective ends of the second portions (252ab to 252hb).

Here, regarding first inductor patterns (252a to 252h), an interval between patterns adjacent to each other is preferred to be set at 10 to 50 µm. If the interval between the adjacent first inductor patterns (252a to 252h) is equal to or larger than 10 µm, it is easy to obtain insulation between them, compared with cases where the interval is smaller than 10 µm. If the interval between the adjacent first inductor patterns (252a to 252h) is equal to or smaller than 50 µm, the inductor element 250 is structured more compactly, compared with cases where the interval is larger than 50 µm. In addition, the area of the magnetic material layer 253 is effectively used.

As illustrated in FIG. 35, the resin layer 254 is formed on the magnetic material layer 253. The magnetic material layer 253 and the resin layer 254 constitute an interlayer insulation layer. Second inductor patterns (255a to 255h) and electrodes (280a, 280b) are formed on the resin layer 254. The via conductors (261a to 261h, 270a to 270h) penetrate through the resin layer 254.

As illustrated in FIG. 37, the second inductor patterns (255a to 255h) have first portions (255aa to 255ha) which overlap the magnetic material layer (256a), and second portions (255ab to 255hb) which are the rest of second inductor patterns (255a to 255h) respectively. The first portions (255aa to 255ha) are formed in a C-shape. The first portions mainly serve as inductors. Second output pads (266a to 266h) and second input pads (265a to 265h) are provided at the respective ends of the second portions (255ab to 255hb).

The electrode (280a) is electrically connected to the first input pads (262a to 262d) through the via conductors (261a to 261d), respectively. The electrode (280b) is electrically connected to the first input pads (262e to 262h) through the via conductors (261e to 261h), respectively. In this manner, since the electrodes (280a, 280b) are provided respectively on the outside of the second inductor patterns (255a to 255h), it is easy to flow electric current to eight inductors formed in the inductor element 250 by connecting an input terminal (not illustrated) to the electrodes (280a, 280b).

As illustrated in FIG. 35, the resin layer 257 is formed on the magnetic material layer 256. The magnetic material layer 256 and the resin layer 257 constitute an interlayer insulation layer. The third inductor patterns (258a to 258h) are formed on the resin layer 257. The via conductors (271a to 271h) penetrate through the resin layer 257.

As illustrated in FIG. 38, the third inductor patterns (258a to 258h) include first portions (258aa to 258ha) which overlap the magnetic material layer 259, and second portions (258ab to 258hb) which are the rest of third inductor patterns (258a to 258h) respectively. The first portions (258aa to 258ha) are formed in a C-shape. The first portions mainly serve as inductors. The third output pads (269a to 269h) and the third input pads (268a to 268h) are provided at the respective ends of the second portions (258ab to 258hb).

As illustrated in FIG. 35, the resin layer 260 is formed on the magnetic material layer 259. The magnetic material layer 259 and the resin layer 260 constitute an interlayer insulation layer. The output terminals (273a to 273h) are formed on the resin layer 260. The output terminals (273a to 273h) are electrically connected to the third output pads (269a to 269h), respectively, through the via conductors (272a to 272h), respectively. The via conductors (272a to 272h) penetrate through the resin layer 260.

In this manner, the first inductor patterns (252a to 252h), the via conductors (270a to 270h), the second inductor patterns (255a to 255h), the via conductors (271a to 271h), and the third inductor patterns (258a to 258h) constitute eight three-turn inductors.

According to the third embodiment, a material of the support layer 251 and each resin material of the interlayer insulation layers (253, 254), the interlayer insulation layers (256, 257), and the interlayer insulation layers (259, 260) are basically arbitrarily determined. A material of the support layer 251 and each resin material of the interlayer insulation layers (253, 254), the interlayer insulation layers (256, 257), and the interlayer insulation layers (259, 260) may include, for example, epoxy resin, polyester resin, bismaleimide triazine resin (BT resin), imide resin (polyimide), phenol resin, allylated phenylene ether resin (A-PPE resin) and the like. Each layer may include multiple layers made of different materials.

A glass transition temperature Tg of the resin of the magnetic material layers (253, 256, 259) is preferably set at 130° C. or higher. If the glass transition temperature Tg of the resin of the magnetic material layers (253, 256, 259) is set at 130° C. or higher, the magnetic material layers (253, 256, 259) are not easily deformed when the inductor element 250 is heated in the wiring board, compared with a case where the glass transition temperature is lower than 130° C.

Basically, an insulative resin material may be used in the resin of the magnetic material layers (253, 256, 259). Preferably, a heat-resistant resin is used. Specifically, the resin of the magnetic material layers (253, 256, 259) preferably includes, for example, epoxy resin, phenol resin, polybenzoxazole resin, polyphenylene resin, polybenzocyclobutene resin, polyarylene ether resin, polysiloxane resin, polyurethane resin, polyester resin, polyester urethane resin, fluororesin, polyolefin resin, polycycloolefin resin, cyanate resin, polyphenylene ether resin, polystyrene resin, a mixture thereof, or the like.

An average particle diameter of magnetic particles of the magnetic material layers (253, 256, 259) is set at, for example, 0.5 to 50 µm. The average particle diameter of the magnetic particles is computed by actually measuring the particle diameters of a hundred magnetic particles using a scanning electron microscope (SEM) photograph, computing the diameter particles according to a magnification of the SEM photograph, and obtaining an arithmetic mean. If the average particle diameter of magnetic particles is equal to or larger than 0.5 µm, cohesion of the magnetic particles becomes difficult, compared with a case where the average particle diameter is smaller than 0.5 µm. As a result, it is easy to uniformly disperse the magnetic particles in the magnetic material layers (253, 256, 259). If the average particle diameter of the magnetic particles is equal to or smaller than 50 µm, frictional resistance between particles is reduced, compared with a case where the average particle diameter is larger than 50 µm. As a result, it is easy to form the magnetic material layers (253, 256, 259) with a uniform thickness.

The volume content of the magnetic particles of the magnetic material layers (253, 256, 259) is preferably set at 30 to 70 volume %. If the volume content is equal to or higher than 30 volume %, the magnetic characteristics of the inductor element 250 are improved, compared with a case where the volume content is lower than 30 volume %. If the volume content is equal to or lower than 70 volume %, frictional resistance between particles is reduced, compared with a case where the volume content is higher than 70 volume %. For this reason, if the volume content of the magnetic particles is set in the aforementioned range, it is easy to form the magnetic material layers (253, 256, 259) with a uniform thickness.

As the magnetic material of the magnetic particles, any soft magnetic material may be used. For example, the soft magnetic material may include iron, a soft magnetic iron alloy, nickel, a soft magnetic nickel alloy, cobalt, a soft magnetic cobalt alloy, a soft magnetic iron(Fe)-silicon(Si)-based alloy, a soft magnetic iron(Fe)-nitrogen(N)-based alloy, a soft magnetic iron(Fe)-carbon(C)-based alloy, a soft magnetic iron (Fe)-boron(B)-based alloy, a soft magnetic iron(Fe)-phosphorous(P)-based alloy, a soft magnetic iron(Fe)-aluminum (Al)-based alloy, a soft magnetic iron(Fe)-aluminum(A1)-silicon(Si)-based alloy and the like.

The thicknesses of the magnetic material layers (253, 256, 259) are larger than the thicknesses of the resin layers (254, 257, 260) in a portion where the magnetic material layers (253, 256, 259) exist. As a result, a sufficient amount of the magnetic particles can be contained in the magnetic material layers (253, 256, 259), and magnetic characteristics of the inductor element 250 are improved. Specifically, the thicknesses of the magnetic material layers (253, 256, 259) are within a range of, for example, 20 to 100 and the thicknesses of the resin layers (254, 257, 260) are preferably within a range of, for example, 10 to 60 μm in a portion where the magnetic material layers (253, 256, 259) exist.

The resin layers (254, 257, 260) are formed of a resin material. Basically, the resin material may be an insulative resin material. Preferably, the resin material is heat-resistant. Specifically, the resin material includes, for example, epoxy resin, phenol resin, polybenzoxazole resin, polyphenylene resin, polybenzocyclobutene resin, polyarylene ether resin, polysiloxane resin, polyurethane resin, polyester resin, polyester urethane resin, fluororesin, polyolefin resin, polycycloolefin resin, cyanate resin, polyphenylene ether resin, polystyrene resin, a mixture thereof, and the like.

Preferably, the resin material of the magnetic material layers (253, 256, 259) is the same as the resin material of the resin layers (254, 257, 260). If the same material is used between the resin material of the magnetic material layers and the resin material of the resin layers, adhesion between the magnetic material layers (253, 256, 259) and the resin layers (254, 257, 260) is improved. In addition, linear expansion coefficients of the resin layers (254, 257, 260) are preferably lower than those of the magnetic material layers (253, 256, 259). If a linear expansion coefficient of the resin layer is lower than that of the magnetic material layer, a possibility of thermal deformation in the magnetic material layers (253, 256, 259) is reduced.

According to the third embodiment, epoxy resin is used as a material of the support layer 251. In addition, the same material is preferably used in the resin of the magnetic material layers (253, 256, 259) and the resin of the resin layers (254, 257, 260). Therefore, epoxy resin is used in each material.

The support layer 251 and the resin layers (254, 257, 260) may contain an inorganic filler. As a result, it is easy to make the linear expansion coefficients of the resin layers (254, 257, 260) lower than those of the magnetic material layers (253, 256, 259). The inorganic filler may include, for example, glass fiber, glass particles, calcium carbonate, sodium carbonate, barium sulfate, aluminum hydroxide, alumina, silica, diatomite, mica, talc or the like.

In the inductor element 250 according to the third embodiment, the first portions (252aa to 252ha, 255aa to 255ha, 258aa to 258ha) of the first inductor pattern (252a to 252h), the second inductor pattern (255a to 255h), and the third inductor patterns (258a to 258h) are covered by the magnetic material layers (253, 256, 259), respectively. The second portions (252ab to 252hb, 255ab to 255hb, 258ab to 258hb) of each inductor pattern are extracted from the turn portions of each inductor pattern. In addition, the input pad, the output pad, and the via conductor are provided in each of the second portions (252ab to 252hb, 255ab to 255hb, 258ab to 258hb). Therefore, inductance is improved using the magnetic material layer.

That is, in the inductor element 250, the inductor pattern is connected in a portion where the magnetic material layer is not provided thereon. As a result, in a case where the magnetic material layer has the same area, the effective area of the magnetic material layer relative to the inductor pattern increases, compared with a case where a via hole is formed in the magnetic material layer to connect the inductor pattern. Therefore, inductance is increased without increasing the area of the magnetic material layer. As a result, the inductor element is made thinner. Accordingly, since the inductor element is made thinner without inductance being degraded, miniaturization of the wiring board is achieved.

As described above, in the inductor element 250 according to the third embodiment, the second portions (252ab to 252hb, 255ab to 255hb, 258ab to 258hb) of the first inductor patterns (252a to 252h), the second inductor patterns (255a to 255h), and the third inductor patterns (258a to 258h) are extracted from respective turn portions. As a result, the first portions (252aa to 252ha, 255aa to 255ha, 258aa to 258ha) and the second portions (252ab to 252hb, 255ab to 255hb, 258ab to 258hb) are partitioned along a straight line. As a result, the magnetic paste is easily applied.

That is, the first input pads (262a to 262h), the second input pads (265a to 265h), the third input pads (268a to 268h), the first output pads (263a to 263h), the second output pads (266a to 266h), and the third output pads (269a to 269h) are extracted to the outside of the turn portion. For this reason, the first portions (252aa to 252ha, 255aa to 255ha, 258aa to 258ha) and the second portions (252ab to 252hb, 255ab to 255hb, 258ab to 258hb) of each inductor pattern are partitioned along a single straight line. As a result, as illustrated in FIGS. 36 to 38, the magnetic paste is applied onto a rectangular shape. In addition, the magnetic paste is applied to each layer in a single application. That is, each of the magnetic material layers (253, 256, 259) is provided in the shape of a flat plate.

In addition, the planar shapes of the first portions (252aa to 252ha, 255aa to 255ha, 258aa to 258ha) of each inductor pattern, that is, the outer edge of the turn portion, are approximately rectangular. As a result, the area of the turn portion covered by the magnetic material layers (253, 256, 259) increases, compared with a case where the planar shape of the outer edge of the turn portion is approximately circular. In addition, the amount of the magnetic material filled in the internal area of the turn portion of the first inductor pattern also increases, compared with a case where the planar shape of the outer edge of the turn portion is approximately circular. For this reason, it is thought that the effect of improving inductance using the magnetic material layers (253, 256, 259) is also enhanced, compared with a case where the planar shape of the outer edge of the turn portion is approximately circular.

A method of manufacturing the inductor element 250 is substantially similar to the method of manufacturing the inductor element 210 according to the first embodiment or the method of manufacturing the inductor element 230 according to the second embodiment described above.

Specifically, a conductive layer is formed on the support layer 251 supported by the support body, and eight first inductor patterns (252a to 252h) are formed through etching. The magnetic paste is coated on the first portions (252aa to 252ha) of the first inductor patterns (252a to 252h), respectively, and is thermally cured, so that the magnetic material layer 253 is formed. Subsequently, the resin layer 254 having a metal foil is laminated, and a hole is opened, for example, using a laser. Subsequently, the via conductors (261a to 261h, 270a to 270h) and the conductive layer are formed through electroless plating and electrolytic plating. The conductive layer is etched to form eight second inductor patterns (255a to 255h) and the electrodes (280a, 280b).

Subsequently, the magnetic paste is coated on the first portions (255aa to 255ha) of the second inductor patterns (255a to 255h) and is thermally cured to form the magnetic material layer 256. Subsequently, the resin layer 257 having a metal foil is laminated, and a hole is opened, for example, using a laser. Subsequently, electroless plating and electrolytic plating are performed to form the via conductors (271a to 271h) and the conductive layer. The conductive layer is etched to form eight third inductor patterns (258a to 258h). Subsequently, the magnetic paste is coated on the first portions (258aa to 258ha) of the third inductor patterns (258a to 258h), and is thermally cured to form the magnetic material layer 259. Subsequently, the resin layer 260 is laminated, and a hole is opened, for example, using a laser. Subsequently, electroless plating and electrolytic plating are performed to form the output terminals (273a to 273h). Then, the support body is removed so that the inductor element 250 illustrated in FIGS. 35 to 38 is completed.

The manufacturing method according to the third embodiment is suitable for manufacturing the inductor element 250. Using such a manufacturing method, it is thought that an excellent inductor element 250 can be obtained at low cost.

Figure 39:
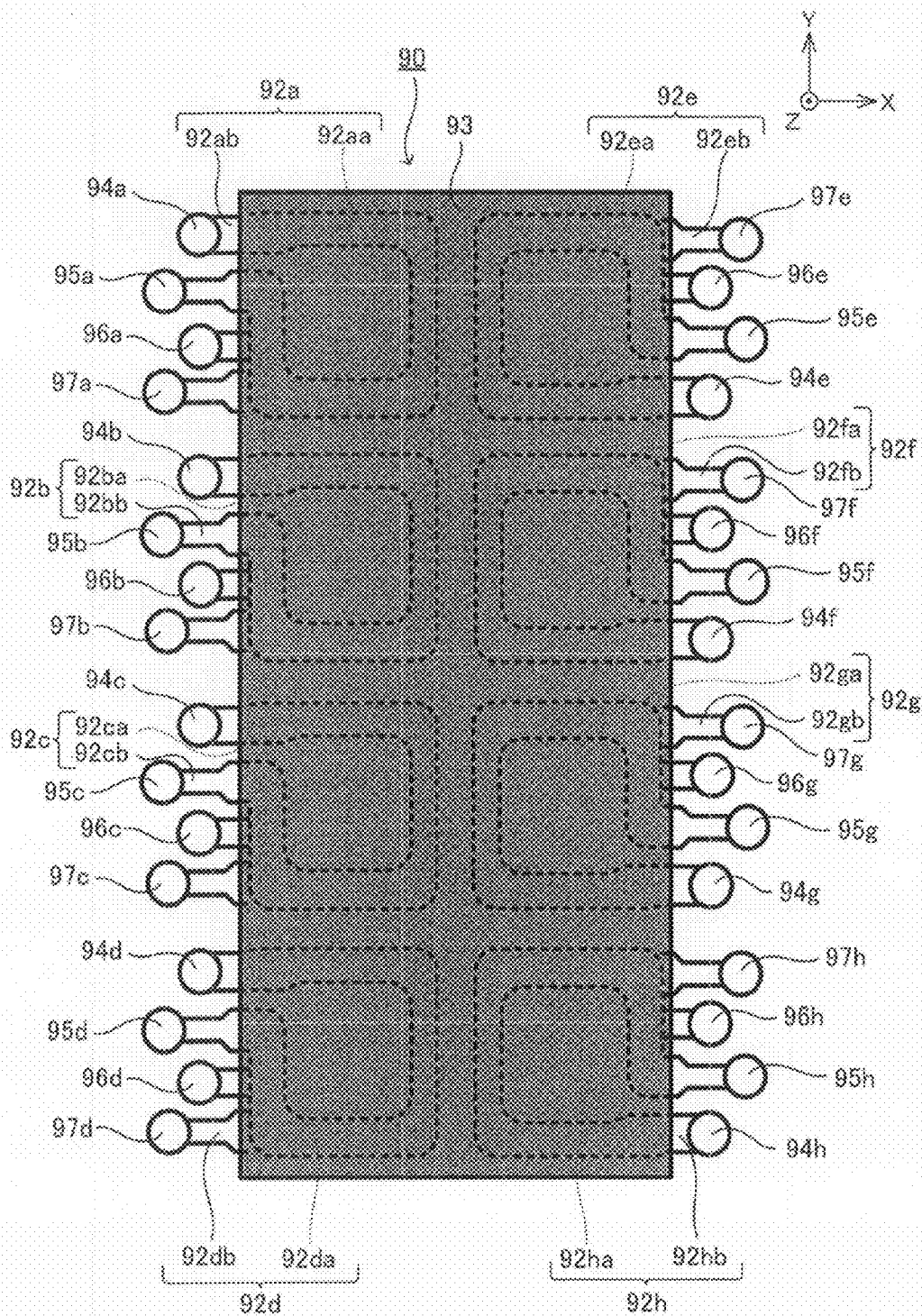
FIG. 39 is a plan view illustrating a first layer of the inductor element according to a first modification of the third embodiment of the present invention.

Next, a first modification of the third embodiment of the present invention will be described with reference to FIG. 39. FIG. 39 is a schematic diagram illustrating a first layer of the inductor element 90 according to a first modification of the third embodiment of the present invention as seen from the +Z direction. Resin layers are not shown in FIG. 39.

Similar to the inductor element 250 described above, the inductor element 90 includes a support layer, a first layer on the support layer, a second layer on the first layer, a third layer on the second layer, and an output terminal on the third layer. As illustrated in FIG. 39, each layer of the inductor element 90 has eight inductor patterns.

The first layer of the inductor element 90 includes eight first inductor patterns (92a to 92h), a magnetic material layer 93 and a resin layer. Each of the first inductor patterns (92a to 92h) has a pair of first input pads (94a to 94h, 96a to 96h), respectively, and a pair of output pads (95a to 95h, 97a to 97h), respectively. The first inductor patterns (92a to 92h) are partitioned into first portions (92aa to 92ha), respectively, indicated by the dotted line and second portions (92ab to 92hb), respectively, indicated by the solid line. In the first portions (92aa to 92ha) indicated by the dotted line out of the first inductor patterns (92a to 92h), a magnetic material layer 93 is provided thereon. In the second portions (92ab to 92hb) indicated by the solid line, the magnetic material layer 93 is not provided thereon.

The first inductor patterns (92a to 92h) have first output pads (95a to 95h, 97a to 97h), respectively, at one end. The first inductor patterns (92a to 92h) have first input pads (94a to 94h, 96a to 96h), respectively, at the other end. The magnetic material layer 93 is formed on the first inductor patterns (92a to 92h). The magnetic material layer 93 contains magnetic particles and resin.

In the inductor element 90 according to the first modification of the third embodiment, the first portions of the first inductor patterns (92a to 92h), the second inductor patterns and the third inductor patterns are covered by the magnetic material layer 93, the magnetic material layer of the second layer and the magnetic material layer of the third layer, respectively. In addition, in the inductor element 90 according to the first modification of the third embodiment, the second portions of the first inductor patterns (92a to 92h), the second inductor patterns and the third inductor patterns are extracted from respective turn portions. In addition, the input pad, the output pad and the via conductor are provided in the second portions.

Therefore, in the inductor element 90, the inductor patterns are connected at the portion extracted from the magnetic material layer. As a result, in a case where the area of the magnetic material layer is the same, the effective area of the magnetic material layer relative to the inductor pattern increases, compared with a case where a via hole is formed in the magnetic material layer to connect the inductor pattern. Therefore, inductance is increased without increasing the area of the magnetic material layer. As a result, the inductor element is made thinner. Accordingly, since the inductor element is made thinner without inductance being degraded, miniaturization of the wiring board is achieved.

As illustrated in FIG. 39, the first input pads (94a to 94h, 96a to 96h) and the first output pads (95a to 95h, 97a to 97h) are extracted to the outside of the turn portion. For this reason, the first portions (92aa to 92ha) and the second portions (92ab to 92hb) of the first inductor patterns (92a to 92h) are partitioned along a single straight line. As a result, the magnetic paste is applied in a rectangular shape and the coating of the magnetic paste is completed on each layer in a single application. That is, each magnetic material layer is provided in the shape of a flat plate.

The planar shape of the outer edge of the turn portion included in the first portions (92aa to 92ha) of the first inductor patterns (92a to 92h) is approximately rectangular. As a result, the area of the turn portion covered by the magnetic material layer 93 increases, compared with a case where the planar shape of the outer edge of the turn portion is approximately circular. In addition, the amount of the magnetic material filled in the internal area of the turn portion of the first inductor patterns (92a to 92h) also increases, compared with a case where the planar shape of the outer edge of the turn portion is approximately circular. For this reason, it is thought that the effect of improving inductance using the magnetic material layer 93 is enhanced, compared with a case where the planar shape of the outer edge of the turn portion is approximately circular. This similarly applies to the second and third layers (not illustrated).

A method of manufacturing the inductor element 90 is similar to the method of manufacturing the inductor element 250 described above.

Specifically, a conductive layer is formed on the support layer supported by the support body, and eight first inductor patterns (92a to 92h) are formed through etching. A magnetic paste is coated on the first portions (92aa to 92ha) of the first inductor patterns (92a to 92h), respectively, and is thermally cured to form the magnetic material layer 93. Subsequently, a resin layer having a metal foil is laminated, and a hole is opened, for example, using a laser. Subsequently, via conductors and conductive layers are formed through electroless plating and electrolytic plating. The conductive layers are etched to form eight second inductor patterns and electrodes.

Subsequently, the magnetic paste is coated on the first portions of the second inductor patterns and is thermally cured to form the magnetic material layer. Subsequently, the resin layer having a metal foil is laminated, and a hole is opened, for example, using a laser. Subsequently, electroless plating and electrolytic plating are performed to form via conductors and conductive layers. The conductive layers are etched to form eight third inductor patterns. Subsequently, the magnetic paste is coated on the first portions of the third inductor patterns and is thermally cured to form the magnetic material layer. Subsequently, a resin layer is laminated, and a hole is opened, for example, using a laser. Subsequently, electroless plating and electrolytic plating are performed to form the output terminal. In addition, as the support body is removed, the inductor element 90 including the first layer illustrated in FIG. 39 is completed.

Figure 40:
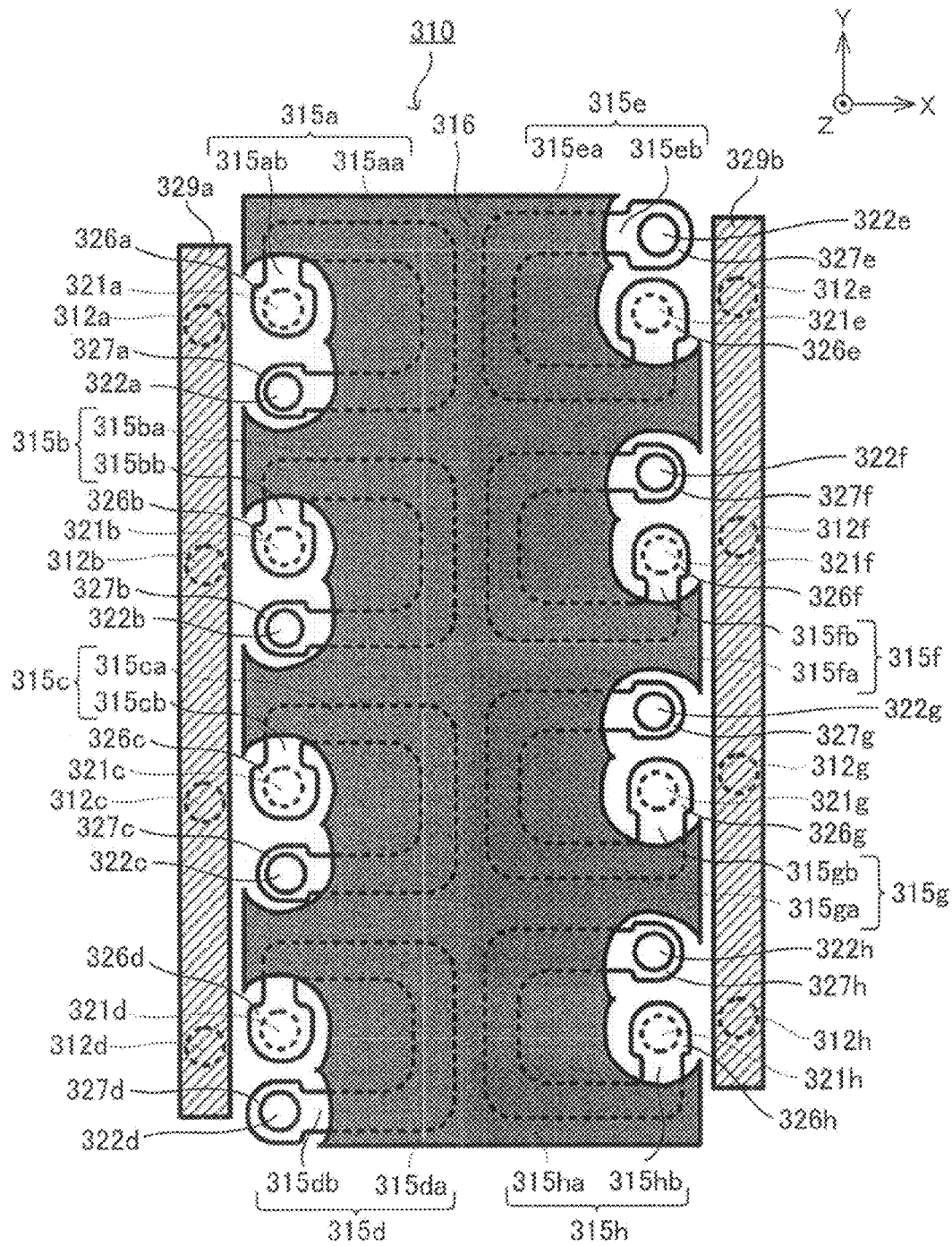
FIG. 40 is a plan view illustrating a first layer of the inductor element according to a second modification of the third embodiment of the present invention.

Next, a second modification of the third embodiment of the present invention will be described with reference to FIG. 40. FIG. 40 is a schematic diagram illustrating the first layer of the inductor element 310 according to a second modification of the third embodiment of the present invention as seen from the +Z direction. Resin layers are not shown in FIG. 40.

Similar to the inductor element 90 described above, the inductor element 310 includes a support layer, a first layer on the support layer, a second layer on the first layer, a third layer on the second layer, and an output terminal on the third layer. As illustrated in FIG. 40, each layer of the inductor element 310 has eight inductor patterns.

The first layer of the inductor element 310 includes eight first inductor patterns (315a to 315h), a magnetic material layer 316 and a resin layer. The first inductor patterns (315a to 315h) are partitioned into first portions (315aa, 315ha), respectively, indicated by the dotted line and second portions (315ab to 315hb), respectively, indicated by the solid line. The first portions (315aa to 315ha) indicated by the dotted line out of the first inductor patterns (315a to 315h) are covered by the magnetic material layer 316. The second portions (315ab to 315hb) indicated by the solid line are not covered by the magnetic material layer 316.

The first inductor patterns (315a to 315h) have first output pads (327a to 327h), respectively, at one end. The first inductor patterns (315a to 315h) have first input pads (326a to 326h), respectively, at the other end. The via conductors (321a to 321h) are electrically connected beneath the first input pads (326a to 326h). The via conductors (322a to 322h) are electrically connected to the first output pads (327a to 327h). The magnetic material layer 316 is formed on the first inductor patterns (315a to 315h). The magnetic material layer 316 contains magnetic particles and resin.

In the inductor element 310 according to the second modification of the third embodiment, the first portions of the first inductor patterns (315a to 315h), the second inductor patterns and the third inductor patterns are covered by the magnetic material layer 316, the magnetic material layer of the second layer and the magnetic material layer of the third layer, respectively.

In the inductor element 310 according to the second modification of the third embodiment, the second portions of the first inductor patterns (315a to 315h), the second inductor patterns and the third inductor patterns are included in respective turn portions. As a result, the inductor element 310 is made more compact.

The planar shape of the outer edge of the turn portion included in the first portions (315aa to 315ha) of the first inductor patterns (315a to 315h) is approximately rectangular. As a result, the area of the turn portion covered by the magnetic material layer 316 increases, compared with a case where the planar shape of the outer edge of the turn portion is approximately circular. In addition, the amount of the magnetic material filled in the internal area of the turn portion of the first inductor patterns (315a to 315h) also increases, compared with a case where the planar shape of the outer edge of the turn portion is approximately circular. For this reason, it is thought that the effect of improving inductance using the magnetic material layer 316 is enhanced, compared with a case where the planar shape of the outer edge of the turn portion is approximately circular. This similarly applies to the second and third layers (not illustrated).

A method of manufacturing the inductor element 310 is different from the method of manufacturing the inductor elements (250, 90) described above.

Specifically, a conductive layer is formed on the support layer supported by the support body, and eight first inductor patterns (315a to 315h) and electrodes (329a, 329b) are formed through etching. Subsequently, a magnetic paste is coated on overall first inductor patterns (315a to 315h) in an approximately rectangular planar shape. In addition, the coated magnetic paste is thermally cured to form the magnetic material layer 316. Subsequently, a penetrating hole is formed in the magnetic material layer 316 immediately above the first input pads (326a to 326h) and the first output pads (327a to 327h), for example, using a laser.

Subsequently, a resin layer having a metal foil is laminated on the support layer, the first inductor patterns (315a to 315h) and the magnetic material layer 316, and a hole is opened, for example, using a laser. Subsequently, electroless plating and electrolytic plating are performed to form the via conductors (312a to 312h), the via conductors (322a to 322h) and the conductive layer. The conductive layer is etched to form eight second inductor patterns. Then, the second and third layers are formed in a similar manner. As the support body is removed, the inductor element 310 illustrated as the first layer in FIG. 40 is completed.

Here, the area of the penetrating hole provided in the magnetic material layer 316 is smaller than the area of the entire magnetic material layer 316. As a result, the effective area of the magnetic material layer relative to the inductor pattern increases, compared with a case where a via hole is formed in the magnetic material layer using a single inductor pattern, and the inductor pattern is connected. Therefore, inductance is increased without increasing the area of the magnetic material layer. As a result, the inductor element is made thinner. Accordingly, the inductor element is made thinner without inductance being degraded, and miniaturization of the wiring board is achieved.

Figure 41:
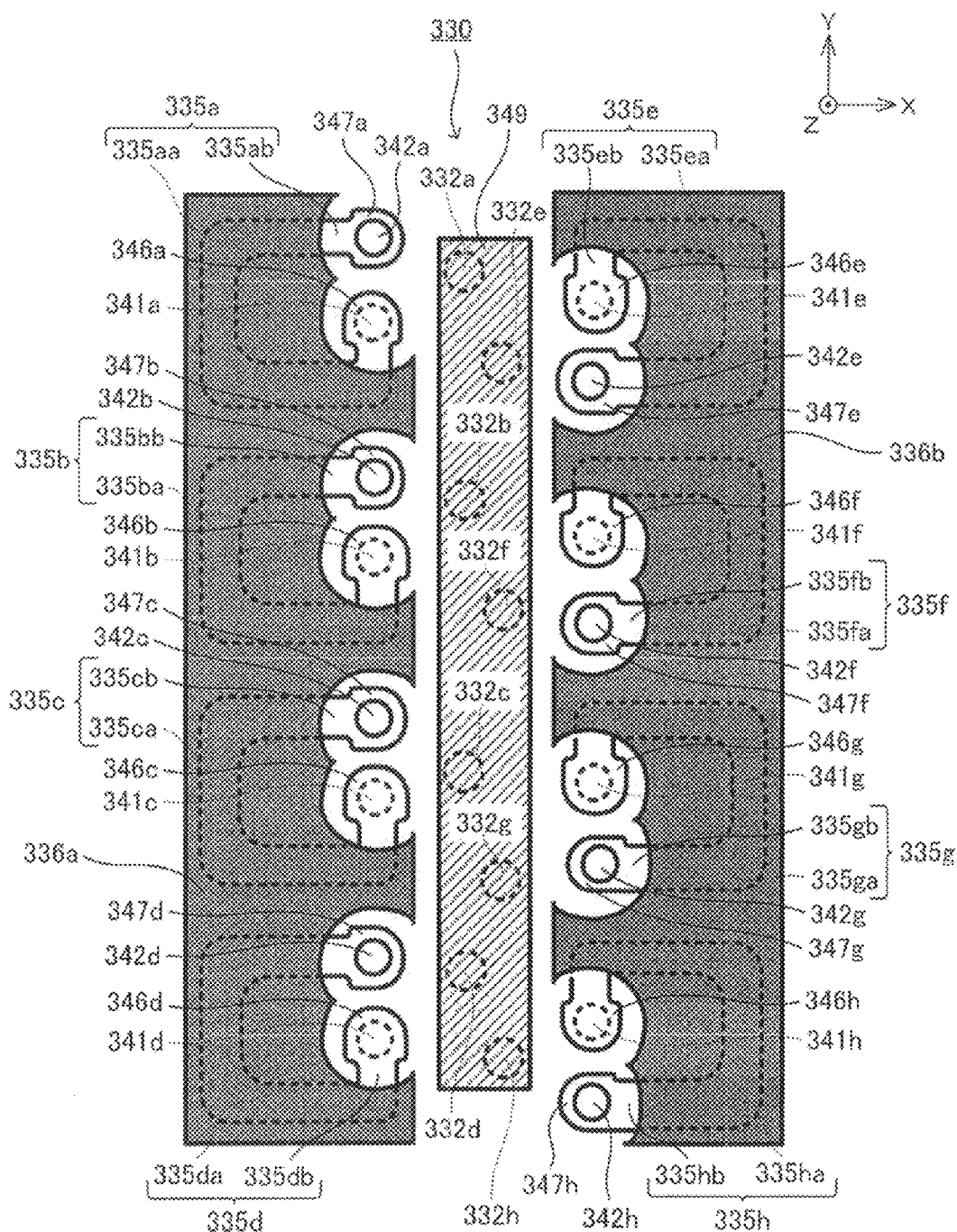
FIG. 41 is a plan view illustrating a first layer of the inductor element according to a third modification of the third embodiment of the present invention.

Next, a third modification of the third embodiment of the present invention will be described with reference to FIG. 41. FIG. 41 is a schematic diagram illustrating the first layer of the inductor element 330 according to a third modification of the third embodiment of the present invention as seen from the +Z direction. Resin layers are not shown in FIG. 41.

Similar to the inductor elements (250, 90, 310) described above, the inductor element 330 includes a support layer, a first layer on the support layer, a second layer on the first layer, a third layer on the second layer, and an output terminal on the third layer. As illustrated in FIG. 41, each layer of the inductor element 330 has eight inductor patterns. The inductor element 330 according to a third modification of the third embodiment is different from the inductor elements (250, 90, 310) described above in that an electrode 349 is located in the center, and the magnetic material layer is divided into two.

The first layer of the inductor element 330 includes eight first inductor patterns (335a to 335h), magnetic material layers (336a, 336b), and a resin layer. The first inductor patterns (335a to 335h) are partitioned into first portions (335aa, 335ha), respectively, indicated by the dotted line and second portions (315ab to 315hb), respectively, indicated by the solid line. The first portions (335aa to 335ha) indicated by the dotted line out of the first inductor patterns (335a to 335h) are covered by the magnetic material layers (336a, 336b). The second portions (335ab to 335hb) indicated by the solid line are not covered by the magnetic material layers (336a, 336b).

The first inductor patterns (335a to 335h) have first output pads (347a to 347h), respectively, at one end. The first inductor patterns (335a to 335h) have first input pads (346a to 346h), respectively, at the other end. The via conductors (341a to 341h) are electrically connected beneath the first input pads (346a to 346h). The via conductors (342a to 342h) are electrically connected to the first output pads (347a to 347h). The magnetic material layer (336a) is formed on the first inductor patterns (335a to 335d). The magnetic material layer (336b) is formed on the first inductor patterns (335e to 335h). The magnetic material layers (336a, 336b) contain magnetic particles and resin.

In the inductor element 330 according to the third modification of the third embodiment, the first portions of the first inductor patterns (335a to 335h), the second inductor patterns and the third inductor patterns are covered by the magnetic material layers (336a, 336b), the magnetic material layer of the second layer and the magnetic material layer of the third layer, respectively.

In the inductor element 330 according to the third modification of the third embodiment, the second portions of the first inductor patterns (335a to 335h), the second inductor patterns and the third inductor patterns are included in respective turn portions. As a result, the inductor element 330 is structured more compactly.

The planar shape of the outer edge of the turn portion included in the first portions (335aa to 335ha) of the first inductor patterns (335a to 335h) is approximately rectangular.

As a result, the area of the turn portion covered by the magnetic material layers (336a, 336b) increases, compared with a case where the planar shape of the outer edge of the turn portion is approximately circular. In addition, the amount of the magnetic material filled in the internal area of the turn portion of the first inductor patterns (335a to 335h) also increases, compared with a case where the planar shape of the outer edge of the turn portion is approximately circular. For this reason, it is thought that the effect of improving inductance using the magnetic material layers (336a and 336b) is enhanced, compared with a case where the planar shape of the outer edge of the turn portion is approximately circular. This similarly applies to the second and third layers (not illustrated).

A method of manufacturing the inductor element 330 is substantially similar to the method of manufacturing the inductor elements 310 described above.

Specifically, a conductive layer is formed on the support layer supported by the support body, and eight first inductor patterns (335a to 335h) and an electrode 349 are formed through etching. Subsequently, a magnetic paste is coated on overall first inductor patterns (335a to 335d, 335e to 335h) in an approximately rectangular planar shape. In addition, the coated magnetic paste is thermally cured to form the magnetic material layers (336a and 336b). Subsequently, a penetrating hole is formed in the magnetic material layers (336a and 336b) immediately above the first input pads (346a to 346h) and the first output pads (347a to 347h), for example, using a laser.

Subsequently, a resin layer having a metal foil is laminated on the support layer, the first inductor patterns (335a to 335h) and the magnetic material layers (336a and 336b), and a hole is opened, for example, using a laser. Subsequently, electroless plating and electrolytic plating are performed to form the via conductors (332a to 332h), the via conductors (342a to 342h) and the conductive layer. The conductive layer is etched to form eight second inductor patterns. Then, the second and third layers are formed using a similar manner. As the support body is removed, the inductor element 330 illustrated as the first layer in FIG. 41 is completed.

Here, the area of the penetrating hole provided in the magnetic material layer 336 is smaller than the area of the entire magnetic material layer 336. As a result, the effective area of the magnetic material layer relative to the inductor pattern increases, compared with a case where a via hole is formed in the magnetic material layer using a single inductor pattern, and the inductor pattern is connected. Therefore, inductance is increased without increasing the area of the magnetic material layer. As a result, a thin inductor element is obtained. Accordingly, a thin inductor element is obtained without degrading inductance and the wiring board is miniaturized.

The present invention is not limited to the aforementioned embodiments. For example, in each of the aforementioned embodiments, the planar shapes of the outer edges of the turn portions of the first inductor patterns, the second inductor patterns, and the third inductor patterns are approximately rectangular. However, the planar shape of the outer edge of the turn portion may be approximately circular, elliptical, polygonal or the like.

The inductor element in each of the aforementioned embodiments has a three-layered stacked structure. However, the present invention is not limited to that, and the stacked structure of the inductor element may be a two-layered structure. If the inductor element is thinned, a stacked structure having four or more layers may be employed.

The seed layer for electrolytic plating is not limited to electroless plated film. Instead of the electroless plated film, a sputtering film or the like may be used as the seed layer.

In addition, structures of the wiring board 10, the inductor elements (210, 230, 250, 90, 310, 330) and the interlayer insulation layer, types of elements thereof, performance, dimensions, materials, shapes, the number of layers, or arrangement may be arbitrarily modified without departing from the spirit and scope of the present invention.

Materials of each inductor pattern are not limited to those described above and may be appropriately changed depending on utilization. For example, the material of the inductor pattern may include metals other than copper or non-metal conductor materials.

The inductor element according to an embodiment of the present invention is suitable for manufacturing a thin wiring board. The wiring board according to an embodiment of the present invention is suitably employed in a mobile phone, a personal computer and the like. The method of manufacturing an inductor element according to an embodiment of the present invention is suitable for manufacturing an inductor element embedded in a wiring board.

According to one aspect of the invention, an inductor element includes: a first insulation layer; a first conductive layer that is provided on the first insulation layer and has a first inductor pattern and a first pad provided at one end of the first inductor pattern; a second insulation layer provided on the first insulation layer and the first conductive layer; and a second conductive layer that is provided on the second insulation layer and has a second inductor pattern and a second pad provided at an end of the second inductor pattern. The second insulation layer includes a magnetic material layer that covers at least part of the first inductor pattern and a resin layer that covers the first pad, the resin layer has an opening for a via conductor where at least part of the first pad is exposed, and the first conductive layer and the second conductive layer are connected using a via conductor internally provided in the opening. The magnetic material layer may contain resin and a magnetic particle. The resin layer may not contain a magnetic particle. The first inductor pattern may be formed in an approximately annular shape as seen in a plan view, and the magnetic material layer be provided in an internal space formed by the first inductor pattern. The first conductive layer may have a third pad provided at the other end of the first inductor pattern, and the third pad be provided on the same side as that of the first pad. The first conductive layer may have multiple first inductor patterns, and the magnetic material layer may cover each of the first inductor patterns. The magnetic material layer may be provided in the shape of a flat plate. The magnetic material layer may be covered by the resin layer. A thickness of the magnetic material layer may be greater than a thickness of the resin layer that covers the magnetic material layer. The first and second inductor patterns may include a metal foil and a plated film on the metal foil. The resin layer may contain a resin component soluble in a roughening solution and a resin component insoluble in a roughening solution.

According to another aspect of the invention, a method of manufacturing an inductor element includes preparing a first insulation layer; forming, on the first insulation layer, a first conductive layer having a first inductor pattern and a first pad provided at one end of the first inductor pattern; forming a second insulation layer on the first insulation layer and the first conductive layer; forming, on the second insulation layer, a second conductive layer having a second inductor pattern and a second pad provided at an end of the second inductor pattern; and forming a via conductor connecting the first and second conductive layers. The second insulation layer includes a magnetic material layer that covers at least part of the first inductor pattern and a resin layer that covers the first pad, the resin layer has an opening for a via conductor where at least part of the first pad is exposed, and a via conductor is internally formed in the opening. The first inductor pattern and the second inductor pattern may be formed using a semi-additive method. The magnetic material layer may be formed by printing. A surface of the resin layer may be roughened using a roughening solution.

According to yet another aspect of the invention, a wiring board includes a core substrate having an opening and an inductor element incorporated in an inner portion of the opening, wherein the inductor element has a first insulation layer, a first conductive layer that is provided on the first insulation layer and has a first inductor pattern and a first pad provided at one end of the first inductor pattern, a second insulation layer provided on the first insulation layer and the first conductive layer, and a second conductive layer that is provided on the second insulation layer and has a second inductor pattern and a second pad provided at an end of the second inductor pattern, the second insulation layer has a magnetic material layer that covers at least part of the first inductor pattern and a resin layer that covers the first pad, the resin layer has an opening for a via conductor where at least part of the first pad is exposed, the first and second conductive layers are connected using a via conductor provided inside the opening.

According to an embodiment of the present invention, the connection reliability of a via conductor used to connect upper and lower inductor patterns is achieved while obtaining desired electrical characteristics in an inductor element.

Obviously, numerous modifications and variations of the present invention are possible in light of the above teachings. It is therefore to be understood that within the scope of the appended claims, the invention may be practiced otherwise than as specifically described herein.

What is claimed is:
1. A wiring board, comprising:
   a substrate having an opening portion; and
   an inductor element positioned in the opening portion of the substrate and comprising a support layer, a first conductive layer formed on the support layer and having a first inductor pattern and a first pad formed at one end portion of the first inductor pattern, a first insulation layer formed on the support layer and the first conductive layer and comprising a magnetic material layer and a resin layer, a second conductive layer formed on the first insulation layer and having a second inductor pattern and a second pad formed at one end portion of the second inductor pattern, and a via conductor formed through the resin layer of the first insulation layer and connecting the first conductive layer and the second conductive layer,
   wherein the magnetic material layer of the first insulation layer is covering at least a portion of the first inductor pattern, the resin layer of the first insulation layer is covering the first pad and has an opening portion exposing at least a portion of the first pad, and the via conductor is formed in the opening portion of the resin layer of the first insulation layer such that the via conductor is physically out of contact with the magnetic material layer.

2. The wiring board according to claim 1, wherein the magnetic material layer of the first insulation layer includes a resin material and magnetic particles dispersed in the resin material.

3. The wiring board according to claim 1, wherein the first inductor pattern of the first conductive layer has a substantially annular shape forming an inner space, and the magnetic material layer of the first insulation layer has a portion which is positioned in an inner space of the substantially annular shape formed by the first inductor pattern.

* * * * *